United States Patent
Wang et al.

(10) Patent No.: US 12,328,071 B2
(45) Date of Patent: Jun. 10, 2025

(54) BIDIRECTIONAL DIRECT CURRENT CONVERTER AND CONTROL METHOD THEREOF

(71) Applicant: Huawei Digital Power Technologies Co., Ltd., Shenzhen (CN)

(72) Inventors: Jun Wang, Shanghai (CN); Lei Shi, Shanghai (CN); Yunfeng Liu, Shanghai (CN); Zhaohui Wang, Nuremberg (DE)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 287 days.

(21) Appl. No.: 18/063,321

(22) Filed: Dec. 8, 2022

(65) Prior Publication Data

US 2023/0179106 A1    Jun. 8, 2023

(30) Foreign Application Priority Data

Dec. 8, 2021   (CN) .......................... 202111489706.5

(51) Int. Cl.
*H02M 3/158*   (2006.01)
*H02M 1/00*   (2006.01)
(Continued)

(52) U.S. Cl.
CPC ......... *H02M 3/158* (2013.01); *H02M 1/0054* (2021.05); *H02M 3/33584* (2013.01); *H03K 17/687* (2013.01)

(58) Field of Classification Search
CPC .. H02M 1/0054; H02M 1/0095; H02M 3/156; H02M 3/158; H02M 3/1588; H02M 3/07
See application file for complete search history.

(56) References Cited

U.S. PATENT DOCUMENTS

2014/0266135 A1*   9/2014  Zhak ...................... H02M 3/07
                                                                      323/311
2016/0190921 A1    6/2016  Kumar et al.
(Continued)

FOREIGN PATENT DOCUMENTS

CN      104901538 A    9/2015
CN      111200309 A    5/2020
(Continued)

OTHER PUBLICATIONS

Miroslav Vasi, et al., "Ultraefficient Voltage Doubler Based on a GaN Resonant Switched-Capacitor Converter," IEEE Journal of Emerging and Selected Topics in Power Electronics, vol. 7, No. 2, Jun. 2019, 14 pages.

(Continued)

*Primary Examiner* — Gary L Laxton
(74) *Attorney, Agent, or Firm* — Conley Rose, P.C.

(57) ABSTRACT

A bidirectional direct current converter includes a controller that controls a switching transistor in the bidirectional direct current converter to reduce an inductance of an inductor, thereby reducing a size and costs of the inductor, and further reducing a size and costs of the entire bidirectional direct current converter. The bidirectional direct current converter further includes a first switching transistor, a second switching transistor, a third switching transistor, a fourth switching transistor, and a capacitor. The controller is coupled to the first switching transistor, the second switching transistor, the third switching transistor, and the fourth switching transistor. The controller performs complementary control on the first switching transistor and the third switching transistor, and performs complementary control on the second switching transistor and the fourth switching transistor.

20 Claims, 9 Drawing Sheets

(51) Int. Cl.
  *H02M 3/335*  (2006.01)
  *H03K 17/687*  (2006.01)

(56) References Cited

U.S. PATENT DOCUMENTS

| | | | |
|---|---|---|---|
| 2017/0250617 A1 | 8/2017 | Kondo et al. | |
| 2017/0324321 A1* | 11/2017 | Høyerby | H02M 7/4837 |
| 2017/0373586 A1 | 12/2017 | Zhang et al. | |
| 2018/0026518 A1 | 1/2018 | Liu et al. | |
| 2018/0034364 A1* | 2/2018 | Nakada | H02M 3/07 |
| 2018/0183333 A1* | 6/2018 | Uenaka | H02M 1/38 |

FOREIGN PATENT DOCUMENTS

| | | |
|---|---|---|
| CN | 210867509 U | 6/2020 |
| EP | 3242385 A1 | 11/2017 |
| EP | 3709497 A1 | 9/2020 |
| EP | 3846329 A1 | 7/2021 |
| JP | 2014192983 A | 10/2014 |
| WO | 2012074967 A1 | 6/2012 |
| WO | 2016125682 A1 | 8/2016 |
| WO | 2020112207 A2 | 6/2020 |
| WO | 2022016891 A1 | 1/2022 |

OTHER PUBLICATIONS

Handong Gui, et al., "Modeling and Mitigation of Multiloops Related Device Overvoltage in Three-Level Active Neutral Point Clamped Converter," IEEE Transactions on Power Electronics, Dec. 27, 2019, 13 pages.

Chen Siyuan et al: "Bidirectional H8 AC-DC Topology Combining Advantages of Both Diode-Clamped and Flying-Capacitor Three-Level Converters",IEEE Journal of Emerging and Selected Topics in Power Electronics, IEEE, Piscataway, NJ, USA, vol. 10, No. 4, Jun. 10, 2021 (Jun. 10, 2021), pp. 3643-3651, XP011916814.

* cited by examiner

BIDIRECTIONAL DIRECT CURRENT CONVERTER AND CONTROL METHOD THEREOF

CROSS-REFERENCE TO RELATED APPLICATION

This claims priority to Chinese Patent Application No. 202111489706.5 filed on Dec. 8, 2021, which is hereby incorporated by reference in its entirety.

TECHNICAL FIELD

This disclosure relates to the field of energy technologies, and in particular, to a bidirectional direct current converter and a control method thereof in the field of energy technologies.

BACKGROUND

A direct current converter is a power electronic apparatus that can convert a direct current of one voltage class into a direct current of another voltage class. Direct current converters are usually classified into unidirectional direct current converters and bidirectional direct current converters. A unidirectional direct current converter is a direct current converter that can perform only unidirectional power transmission, and a bidirectional direct current converter is a direct current converter that can perform bidirectional power transmission.

For the bidirectional direct current converter, how to reduce an inductance of an inductor in the bidirectional direct current converter by controlling a switching transistor in the bidirectional direct current converter, to reduce a size and costs of the inductor becomes a technical problem that needs to be resolved urgently.

SUMMARY

This disclosure provides a bidirectional direct current converter and a control method thereof. A controller performs complementary control on a first switching transistor and a third switching transistor, and performs complementary control on a second switching transistor and a fourth switching transistor, to reduce an inductance of an inductor, thereby reducing a size and costs of the inductor, and further reducing a size and costs of the entire bidirectional direct current converter.

According to a first aspect, this disclosure provides a bidirectional direct current converter. The bidirectional direct current converter may include a first switching transistor, a second switching transistor, a third switching transistor, a fourth switching transistor, a capacitor, an inductor, and a controller.

Optionally, the bidirectional direct current converter may include a first direct current terminal, a second direct current terminal, a third direct current terminal, and a fourth direct current terminal.

In an example, the first direct current terminal and the second direct current terminal may constitute an input terminal of the bidirectional direct current converter, and the third direct current terminal and the fourth direct current terminal may constitute an output terminal of the bidirectional direct current converter. Therefore, the bidirectional direct current converter may implement forward power transmission by using the four direct current terminals.

In another example, the third direct current terminal and the fourth direct current terminal may constitute an input terminal of the bidirectional direct current converter, and the first direct current terminal and the second direct current terminal may constitute an output terminal of the bidirectional direct current converter. Therefore, the bidirectional direct current converter may implement reverse power transmission by using the four direct current terminals.

Further, a first terminal of the inductor may be configured to connect to the first direct current terminal, and a second terminal of the inductor may be configured to connect to a first node. A first electrode of the first switching transistor may be configured to connect to the first node, and a second electrode of the first switching transistor may be configured to connect to a second node. A first electrode of the second switching transistor may be configured to connect to the second node, and a second electrode of the second switching transistor may be configured to connect to the second direct current terminal and the fourth direct current terminal. A first electrode of the third switching transistor may be configured to connect to the first node, and a second electrode of the third switching transistor may be configured to connect to a third node. A first electrode of the fourth switching transistor may be configured to connect to the third node, and a second electrode of the fourth switching transistor may be configured to connect to the third direct current terminal. A first terminal of the capacitor may be configured to connect to the third node, and a second terminal of the capacitor may be configured to connect to the second node. The controller may be configured to connect to the first switching transistor, the second switching transistor, the third switching transistor, and the fourth switching transistor.

Based on the foregoing connection relationship, the controller may be configured to perform complementary control on the first switching transistor and the third switching transistor, and perform complementary control on the second switching transistor and the fourth switching transistor.

The complementary control may be used to indicate that two switching transistors in complementary control cannot be simultaneously turned on or off. For example, the first switching transistor and the third switching transistor cannot be simultaneously turned on or off, and the second switching transistor and the fourth switching transistor cannot be simultaneously turned on or off.

That is, the controller may control the first switching transistor and the third switching transistor not to be simultaneously turned on or off, and the controller may further control the second switching transistor and the fourth switching transistor not to be simultaneously turned on or off.

The controller may be further configured to control a quantity of on times of the second switching transistor to be greater than a quantity of on times of the first switching transistor in a same cycle. It may also be understood as that, in one cycle, the controller may control a switching frequency of the second switching transistor to be greater than a switching frequency of the first switching transistor, thereby reducing losses of the first switching transistor and the second switching transistor.

In this disclosure, the controller may control the quantity of on times of the second switching transistor to be different from the quantity of on times of the first switching transistor in a same cycle. This can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, in any cycle of the first switching transistor, there may be a delay between an on moment of the first switching transistor and an on moment of the second switching transistor. That is, the first switching transistor and the second switching transistor are not simultaneously turned on in any cycle.

Further, a cycle of the first switching transistor may be the same as a cycle of the third switching transistor.

In a possible implementation, the controller is further configured to control a quantity of on times of the fourth switching transistor to be greater than a quantity of on times of the third switching transistor in a same cycle. It may also be understood as that, in one cycle, the controller may control a switching frequency of the fourth switching transistor to be greater than a switching frequency of the third switching transistor, thereby reducing losses of the third switching transistor and the fourth switching transistor.

It may be understood that the controller controls the quantity of on times of the fourth switching transistor to be different from the quantity of on times of the third switching transistor in a same cycle. Similarly, this can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, the controller is configured to send a first drive signal to the first switching transistor, send a second drive signal to the second switching transistor, send a third drive signal to the third switching transistor, and send a fourth drive signal to the fourth switching transistor. That is, the controller may send the drive signals to the switching transistors, to implement complementary control on the first switching transistor and the third switching transistor, and implement complementary control on the second switching transistor and the fourth switching transistor.

For example, the controller sends the first drive signal to the first switching transistor, to control on and off of the first switching transistor. It may be understood that the first drive signal may be used to indicate the first switching transistor to be turned on, or the first drive signal may be used to indicate the first switching transistor to be turned off.

Similarly, the controller sends the second drive signal to the second switching transistor, to control on and off of the second switching transistor. It may be understood that the second drive signal may be used to indicate the second switching transistor to be turned on, or the second drive signal may be used to indicate the second switching transistor to be turned off.

The controller sends the third drive signal to the third switching transistor, to control on and off of the third switching transistor. It may be understood that the third drive signal may be used to indicate the third switching transistor to be turned on, or the third drive signal may be used to indicate the third switching transistor to be turned off.

The controller sends the fourth drive signal to the fourth switching transistor, to control on and off of the fourth switching transistor. It may be understood that the fourth drive signal may be used to indicate the fourth switching transistor to be turned on, or the fourth drive signal may be used to indicate the fourth switching transistor to be turned off.

Optionally, when the first drive signal is at a high level, the first switching transistor may be turned on, and when the first drive signal is at a low level, the first switching transistor may be turned off.

Similarly, when the third drive signal is at a high level, the third switching transistor may be turned on, and when the third drive signal is at a low level, the third switching transistor may be turned off.

It may be understood that the first drive signal may be complementary to the third drive signal. That is, when the first drive signal is at a high level, the third drive signal may be at a low level. Similarly, when the first drive signal is at a low level, the third drive signal may be at a high level.

It should be noted that there is a delay interval between a falling edge of the first drive signal and a rising edge of the third drive signal. That is, in a range of the delay interval, the first switching transistor and the third switching transistor are simultaneously turned off.

Optionally, when the second drive signal is at a high level, the second switching transistor may be turned on, and when the second drive signal is at a low level, the second switching transistor may be turned off.

Similarly, when the fourth drive signal is at a high level, the fourth switching transistor may be turned on, and when the fourth drive signal is at a low level, the fourth switching transistor may be turned off.

It may be understood that the second drive signal may be complementary to the fourth drive signal. That is, when the second drive signal is at a high level, the fourth drive signal may be at a low level. Similarly, when the second drive signal is at a low level, the fourth drive signal may be at a high level.

Optionally, in any cycle of the first switching transistor, there may be a delay between the on moment of the first switching transistor and the on moment of the second switching transistor. Therefore, in each cycle of the first drive signal, a rising edge of a first drive pulse of N drive pulses in the second drive signal may be behind the falling edge of the first drive signal. That is, there is a delay time (namely, a delay) between a first drive pulse of two drive pulses in the second drive signal and the first drive signal.

Similarly, in each cycle of the third drive signal, a rising edge of a first drive pulse of N drive pulses in the fourth drive signal may be in front of a falling edge of the third drive signal. That is, there is a delay between a first drive pulse of two drive pulses in the fourth drive signal and the third drive signal.

In a possible implementation, the cycle of the first switching transistor may be the same as the cycle of the third switching transistor. Therefore, a cycle of the first drive signal may be the same as a cycle of the third drive signal.

Further, the second drive signal may have N drive pulses in each cycle of the first drive signal, that is, the second drive signal and the first drive signal may be two asymmetric drive signals.

Similarly, the fourth drive signal may have N drive pulses in each cycle of the third drive signal, that is, the fourth drive signal pulse-width modulation (PWM) and the third drive signal PWM are two asymmetric drive signals.

Further, the inductor may have N+1 charging and discharging cycles in each cycle of the first drive signal or the third drive signal, where N is an integer greater than or equal to 2 (for example, N is greater than 3).

Therefore, the inductor has at least three charging and discharging cycles in each cycle. The controller increases a charging and discharging frequency of the inductor in each cycle (namely, frequency increase), thereby reducing the inductance of the inductor, and reducing the size and the costs of the inductor.

It should be noted that there is also a delay interval between a falling edge of the first drive pulse of the N drive pulses in the fourth drive signal and the rising edge of the first drive pulse of the N drive pulses in the second drive signal. In a range of the delay interval, the second switching transistor and the fourth switching transistor are simultaneously turned off.

Because the second drive signal may have N drive pulses in each cycle of the first drive signal, a cycle of the second drive signal is different from the cycle of the first drive signal. Similarly, because the fourth drive signal may also have N drive pulses in each cycle of the third drive signal, a cycle of the fourth drive signal is different from the cycle of the third drive signal.

In the bidirectional direct current converter provided in this disclosure, the controller may send the first drive signal and the second drive signal that are asymmetric to the first switching transistor and the second switching transistor, and send the third drive signal and the fourth drive signal that are asymmetric to the third switching transistor and the fourth switching transistor, so that a quantity of charging and discharging times of the inductor in each cycle of the first drive signal or the third drive signal is increased, that is, the charging and discharging frequency of the inductor is increased. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In addition, in this disclosure, the asymmetric drive signals are sent to the first switching transistor and the second switching transistor, and the asymmetric drive signals are sent to the third switching transistor and the fourth switching transistor, so that a state of the first switching transistor is opposite to a state of the third switching transistor (that is, the first switching transistor is complementary to the third switching transistor), and a state of the second switching transistor is opposite to a state of the fourth switching transistor (that is, the second switching transistor is complementary to the fourth switching transistor). Further, current sharing or complement is implemented between a branch in which the first switching transistor and the second switching transistor are located and a branch in which the third switching transistor and the fourth switching transistor are located (that is, between two branches), so that a voltage of the capacitor remains stable.

In a possible implementation, the N drive pulses in the second drive signal may be in low level time periods of each cycle of the first drive signal.

Certainly, the N drive pulses in the second drive signal may alternatively be in high level time periods of each cycle of the first drive signal. Alternatively, the N drive pulses in the second drive signal may be divided into a first part of drive pulses and a second part of drive pulses. The first part of drive pulses may be in low level time periods of each cycle of the first drive signal, and the second part of drive pulses may be in high level time periods of each cycle of the first drive signal. This is not limited in this disclosure.

In another possible implementation, the N drive pulses in the fourth drive signal may be divided into a first part of drive pulses and a second part of drive pulses. The first part of drive pulses may be in low level time periods of each cycle of the third drive signal, and the second part of drive pulses may be in high level time periods of each cycle of the third drive signal.

Certainly, the N drive pulses in the fourth drive signal may be all in low level time periods of each cycle of the third drive signal, or may be all in high level time periods of each cycle of the third drive signal. This is not limited in this disclosure.

Optionally, frequencies corresponding to at least two of the N drive pulses in the second drive signal or the fourth drive signal may be different.

It should be noted that a frequency of a drive pulse is inversely proportional to a cycle of the drive pulse. Therefore, cycles corresponding to the at least two of the N drive pulses in the second drive signal or the fourth drive signal are different, so that the frequencies corresponding to the at least two of the N drive pulses in the second drive signal or the fourth drive signal are different.

Further, a frequency corresponding to each of the N drive pulses in the second drive signal or the fourth drive signal may be different.

Optionally, a pulse width of each of the N drive pulses in the second drive signal or the fourth drive signal may be the same.

It should be noted that there is no correspondence between pulse widths and frequencies that are of different drive pulses of the N drive pulses in the second drive signal or the fourth drive signal. That is, when pulse widths of different drive pulses are the same, frequencies of the different drive pulses may be the same or different. Similarly, when frequencies of different drive pulses are the same, pulse widths of the different drive pulses may be the same or different.

In a possible implementation, when N≥3, frequencies of first N−1 drive pulses of the N drive pulses in the second drive signal or the fourth drive signal may be the same, and a frequency of a last drive pulse of the N drive pulses in the second drive signal may be less than the frequencies of the first N−1 drive pulses.

In a possible implementation, a lag time in this disclosure may be defined in the following two manners:

Manner 1: In each cycle of the first drive signal, a time between a rising edge of the first drive signal and the rising edge of the first drive pulse of the N drive pulses in the second drive signal may be a lag time.

Manner 2: In each cycle of the third drive signal, a time between the rising edge of the third drive signal and the rising edge of the first drive pulse of the N drive pulses in the fourth drive signal may be a lag time.

Certainly, the lag time may alternatively be defined in another manner. This is not limited in this disclosure.

The following describes in detail an obtaining process of the lag time.

In an example, because a ripple current of the inductor is affected by the lag time, the controller may obtain the lag time based on the ripple current of the inductor. To reduce the ripple current of the inductor, in each charging and discharging cycle of the inductor, the controller may control a charging current of the inductor to be equal to a discharging current of the inductor to obtain the lag time.

Further, in each charging and discharging cycle of the inductor, the controller may control the charging current of the inductor to be equal to the discharging current of the inductor to obtain the lag time.

Further, the controller may obtain the lag time based on a first voltage of the bidirectional direct current converter, a second voltage of the bidirectional direct current converter, the voltage of the capacitor, and the cycle of the first drive signal/the third drive signal.

Optionally, the first voltage may be used to indicate an input voltage of the bidirectional direct current converter, and the second voltage may be used to indicate an output voltage of the bidirectional direct current converter. Alternatively, the first voltage may be used to indicate an output voltage of the bidirectional direct current converter, and the second voltage may be used to indicate an input voltage of the bidirectional direct current converter.

Further, the controller may obtain the lag time $(D_1+D_2)T_{sw}$ according to the following formula:

$$(V_1+V_c-V_2)D_1T_{sw}=(V_2-V_1)D_2T_{sw}$$

In the formula, $V_1$ may represent the first voltage of the bidirectional direct current converter, $V_2$ may represent the second voltage of the bidirectional direct current converter, $V_c$ may represent the voltage of the capacitor, $T_{sw}$ may represent the cycle of the first drive signal or the third drive signal, $D_1$ may represent a duty cycle of the first drive signal, and $D_2T_{sw}$ may represent the delay time between the rising edge of the first drive pulse of the N drive pulses in the second drive signal and the falling edge of the first drive signal.

In another example, the controller may obtain the lag time based on the loss of the first switching transistor and/or the loss of the second switching transistor, or may obtain the lag time based on the loss of the third switching transistor and/or the loss of the fourth switching transistor.

That is, the controller may obtain the lag time based on only the loss of the first switching transistor, based on only the loss of the second switching transistor, or based on both the loss of the first switching transistor and the loss of the second switching transistor.

Similarly, the controller may obtain the lag time based on only the loss of the third switching transistor, based on only the loss of the fourth switching transistor, or based on both the loss of the third switching transistor and the loss of the fourth switching transistor.

In another example, the controller may obtain the lag time based on the ripple current of the inductor and the loss of at least one of the first switching transistor and the second switching transistor (namely, the loss of the first switching transistor and/or the loss of the second switching transistor), or may obtain the lag time based on the ripple current of the inductor and the loss of at least one of the third switching transistor and the fourth switching transistor (namely, the loss of the third switching transistor and/or the loss of the fourth switching transistor).

It should be noted that the lag time may alternatively be obtained by using another process in this disclosure. This is not limited in this disclosure.

In this disclosure, a loss generated by the bidirectional direct current converter may be reduced based on losses of different switching transistors, thereby improving conversion efficiency of the bidirectional direct current converter.

In a possible implementation, the bidirectional direct current converter provided in this disclosure may further include a fifth switching transistor. A first terminal of the fifth switching transistor may be configured to connect to the second terminal of the capacitor, and a second terminal of the fifth switching transistor may be configured to connect to the second node.

Optionally, the fifth switching transistor may use an insulated gate field-effect transistor, an insulated gate bipolar transistor, a bidirectional switch, or the like. Certainly, the fifth switching transistor may alternatively use another type of controllable power device. A type of the fifth switching transistor is not limited in this disclosure.

In this disclosure, the fifth switching transistor is turned on and off, to protect the second switching transistor from being damaged due to excessively large voltage stress.

In another possible implementation, considering precharging of the capacitor and an abrupt change of a voltage of a bus in the bidirectional direct current converter, the bidirectional direct current converter provided in this disclosure may further include a first diode and a second diode.

Optionally, an anode of the first diode may be configured to connect to the second node, a cathode of the first diode may be configured to connect to a midpoint of the second voltage, an anode of the second diode may be configured to connect to the midpoint of the second voltage, and a cathode of the second diode may be configured to connect to the third node.

It may be understood that a function of the first diode is to clamp a voltage drop borne by the second switching transistor, to prevent the second switching transistor from bearing a voltage of an entire direct current bus when the fourth switching transistor is turned on. Similarly, a function of the second diode is to clamp a voltage drop borne by the fourth switching transistor, to prevent the fourth switching transistor from bearing a voltage of an entire direct current bus when the second switching transistor is turned on. Therefore, the first diode and the second diode may be referred to as clamping diodes.

Further, the first switching transistor, the second switching transistor, the third switching transistor, and the fourth switching transistor separately use any one of the insulated gate field-effect transistor, the insulated gate bipolar transistor, and the bidirectional switch.

Optionally, the first diode and the second diode each may alternatively be replaced with another type of power device. In this case, the controller only needs to send corresponding drive signals, so that the switching transistors implement working modes of the diodes. Details are not described in this disclosure again.

According to a second aspect, this disclosure provides an electronic device. The electronic device may include a bidirectional direct current converter. For detailed descriptions of the bidirectional direct current converter, refer to the foregoing descriptions. Details are not described in this disclosure again.

According to a third aspect, this disclosure provides a control method of a bidirectional direct current converter. The bidirectional direct current converter may include a first switching transistor, a second switching transistor, a third switching transistor, a fourth switching transistor, a capacitor, an inductor, and a controller.

Optionally, the bidirectional direct current converter may include a first direct current terminal, a second direct current terminal, a third direct current terminal, and a fourth direct current terminal.

In an example, the first direct current terminal and the second direct current terminal may constitute an input terminal of the bidirectional direct current converter, and the third direct current terminal and the fourth direct current terminal may constitute an output terminal of the bidirectional direct current converter. Therefore, the bidirectional direct current converter may implement forward power transmission by using the four direct current terminals.

In another example, the third direct current terminal and the fourth direct current terminal may constitute an input terminal of the bidirectional direct current converter, and the first direct current terminal and the second direct current terminal may constitute an output terminal of the bidirectional direct current converter. Therefore, the bidirectional direct current converter may implement reverse power transmission by using the four direct current terminals.

Further, a first terminal of the inductor may be configured to connect to the first direct current terminal, and a second terminal of the inductor may be configured to connect to a first node. A first electrode of the first switching transistor may be configured to connect to the first node, and a second electrode of the first switching transistor may be configured to connect to a second node. A first electrode of the second switching transistor may be configured to connect to the second node, and a second electrode of the second switching transistor may be configured to connect to the second direct current terminal and the fourth direct current terminal. A first electrode of the third switching transistor may be configured to connect to the first node, and a second electrode of the third switching transistor may be configured to connect to a third node. A first electrode of the fourth switching transistor may be configured to connect to the third node, and a second electrode of the fourth switching transistor may be configured to connect to the third direct current terminal. A first terminal of the capacitor may be configured to connect to the third node, and a second terminal of the capacitor may be configured to connect to the second node. The controller may be configured to connect to the first switching transistor, the second switching transistor, the third switching transistor, and the fourth switching transistor.

Therefore, the control method of the bidirectional direct current converter may include the following. The controller performs complementary control on the first switching transistor and the third switching transistor, and performs complementary control on the second switching transistor and the fourth switching transistor.

The complementary control is used to indicate that two switching transistors in complementary control cannot be simultaneously turned on or off. For example, the first switching transistor and the third switching transistor cannot be simultaneously turned on or off, and the second switching transistor and the fourth switching transistor cannot be simultaneously turned on or off.

Optionally, the controller controls a quantity of on times of the second switching transistor to be greater than a quantity of on times of the first switching transistor in a same cycle. It may also be understood as that, in one cycle, the controller may control a switching frequency of the second switching transistor to be greater than a switching frequency of the first switching transistor, thereby reducing losses of the first switching transistor and the second switching transistor.

In the control method provided in this disclosure, the controller controls the quantity of on times of the second switching transistor to be different from the quantity of on times of the first switching transistor in a same cycle. This can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, in any cycle of the first switching transistor, there may be a delay between an on moment of the first switching transistor and an on moment of the second switching transistor. That is, the first switching transistor and the second switching transistor are not simultaneously turned on in any cycle.

Further, a cycle of the first switching transistor may be the same as a cycle of the third switching transistor.

In a possible implementation, the control method may further include the following. The controller controls a quantity of on times of the fourth switching transistor to be greater than a quantity of on times of the third switching transistor in a same cycle. It may also be understood as that, in one cycle, the controller may control a switching frequency of the fourth switching transistor to be greater than a switching frequency of the third switching transistor, thereby reducing losses of the third switching transistor and the fourth switching transistor.

It may be understood that the controller controls the quantity of on times of the fourth switching transistor to be different from the quantity of on times of the third switching transistor in a same cycle. Similarly, this can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

It should be understood that technical solutions of the second aspect and the third aspect of this disclosure are consistent with the technical solution of the first aspect of this disclosure, and beneficial effects obtained by the aspects and corresponding feasible implementations are similar. Details are not described herein again.

BRIEF DESCRIPTION OF DRAWINGS

To describe some of the technical solutions in this disclosure more clearly, the following briefly describes the accompanying drawings for describing embodiments. It is clear that the accompanying drawings in the following description show some embodiments of this disclosure, and a person of ordinary skill in the art may still derive other drawings from these accompanying drawings without creative efforts.

DESCRIPTION OF EMBODIMENTS

The following describes technical solutions of this disclosure with reference to the accompanying drawings.

To make the objectives, technical solutions, and advantages of this disclosure clearer, the following clearly describes the technical solutions in this disclosure with reference to the accompanying drawings in this disclosure. It is clear that the described embodiments are merely a part rather than all of embodiments of this disclosure. All other embodiments obtained by a person of ordinary skill in the art based on embodiments of this disclosure without creative efforts shall fall within the protection scope of this disclosure.

The terms "first", "second", and the like in the specification embodiments, claims, and accompanying drawings of this disclosure are merely used for distinguishing descriptions, and cannot be understood as indicating or implying relative importance, or as indicating or implying a sequence. In addition, the terms "include", "have", and any variation thereof are intended to cover non-exclusive inclusions, for example, a series of steps or units are included. Methods, systems, products, or devices are not limited to those clearly listed steps or units, and other steps or units that are not clearly listed or that are inherent to these processes, methods, products, or devices may be included.

It should be understood that, in this disclosure, "at least one (item)" refers to one or more, and "a plurality of" refers to two or more. The term "and/or" is used for describing an association relationship between associated objects, and represents that three relationships may exist. For example, "A and/or B" may represent the following three cases: only A exists, only B exists, and both A and B exist, where A and B may be singular or plural. The character "/" usually indicates an "or" relationship between associated objects. "At least one of the following items (pieces)" or a similar expression thereof indicates any combination of these items, including a single item (piece) or any combination of a plurality of items (pieces). For example, at least one item (piece) of a, b, or c may represent: a, b, c, "a and b", "a and c", "b and c", or "a, b, and c", where a, b, and c may be singular or plural.

Figure 1:
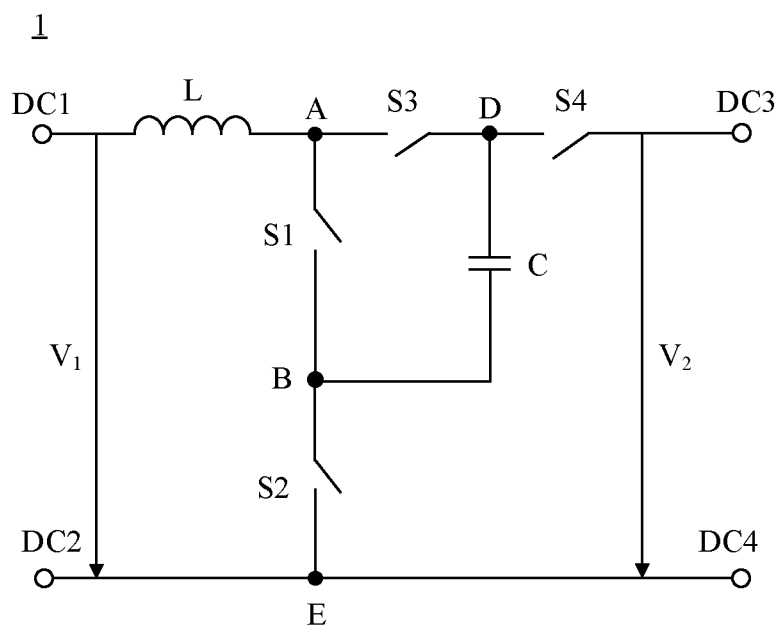
FIG. 1 is a schematic diagram of a structure of a bidirectional direct current converter according to an embodiment of this disclosure.

An embodiment of this disclosure provides a bidirectional direct current converter, as shown in FIG. 1. In FIG. 1, the bidirectional direct current converter 1 may include a first switching transistor S1, a second switching transistor S2, a third switching transistor S3, a fourth switching transistor S4, a capacitor C (flying capacitor), an inductor L, and a controller (not shown in FIG. 1).

Optionally, the bidirectional direct current converter 1 may include a first direct current terminal DC1, a second direct current terminal DC2, a third direct current terminal DC3, and a fourth direct current terminal DC4.

In an example, the first direct current terminal DC1 and the second direct current terminal DC2 may constitute an input terminal of the bidirectional direct current converter 1, and the third direct current terminal DC3 and the fourth direct current terminal DC4 may constitute an output terminal of the bidirectional direct current converter 1. Therefore, in FIG. 1, $V_1$ (namely, a first voltage that is a voltage between the first direct current terminal DC1 and the second direct current terminal DC2) may be used to indicate an input voltage of the bidirectional direct current converter 1, and $V_2$ (namely, a second voltage that is a voltage between the third direct current terminal DC3 and the fourth direct current terminal DC4) may be used to indicate an output voltage of the bidirectional direct current converter 1.

In another example, the third direct current terminal DC3 and the fourth direct current terminal DC4 may constitute an input terminal of the bidirectional direct current converter 1, and the first direct current terminal DC1 and the second direct current terminal DC2 may constitute an output terminal of the bidirectional direct current converter 1. Therefore, in FIG. 1, $V_1$ (namely, a first voltage) may be used to indicate an output voltage of the bidirectional direct current converter 1, and $V_2$ (namely, a second voltage) may be used to indicate an input voltage of the bidirectional direct current converter 1.

It can be learned that the bidirectional direct current converter provided in this embodiment of this disclosure can implement bidirectional power transmission. To be specific, a power may be transmitted from the first direct current terminal DC1 and the second direct current terminal DC2 that are used as the input terminal to the third direct current terminal DC3 and the fourth direct current terminal DC4 that are used as the output terminal, to implement forward power transmission (that is, the bidirectional direct current converter performs forward working).

Similarly, a power may alternatively be transmitted from the third direct current terminal DC3 and the fourth direct current terminal DC4 that are used as the input terminal to the first direct current terminal DC1 and the second direct current terminal DC2 that are used as the output terminal, to implement reverse power transmission (that is, the bidirectional direct current converter performs reverse working).

A first terminal of the inductor L (namely, a left terminal of the inductor L in FIG. 1) may be connected to the first direct current terminal DC1, and a second terminal of the inductor L may be connected to a node A (namely, a first node). A first electrode of the first switching transistor S1

(namely, an electrode that is of the first switching transistor S1 and that is close to the node A in FIG. 1) may be connected to the node A, and a second electrode of the first switching transistor S1 (namely, an electrode that is of the first switching transistor S1 and that is close to a node B in FIG. 1) may be connected to the node B (namely, a second node). A first electrode of the second switching transistor S2 (namely, an electrode that is of the second switching transistor S2 and that is close to the node B in FIG. 1) is connected to the node B, a second electrode of the second switching transistor S2 (namely, an electrode that is of the second switching transistor S2 and that is away from the node B in FIG. 1) may be connected to a node E, and the node E is connected to the second direct current terminal DC2 and the fourth direct current terminal DC4. A first electrode of the third switching transistor S3 (namely, an electrode that is of the third switching transistor S3 and that is close to the node A in FIG. 1) may be connected to the node A, and a second electrode of the third switching transistor S3 (namely, an electrode that is of the third switching transistor S3 and that is close to a node D in FIG. 1) is connected to the node D (namely, a third node). A first electrode of the fourth switching transistor S4 (namely, an electrode that is of the fourth switching transistor S4 and that is close to the node D in FIG. 1) is connected to the node D, and a second electrode of the fourth switching transistor S4 (namely, an electrode that is of the fourth switching transistor S4 and that is close to the third direct current terminal DC3 in FIG. 1) may be connected to the third direct current terminal DC3. A first terminal of the capacitor C (which may be a positive terminal of the capacitor C) may be connected to the node D, and a second terminal of the capacitor C (which may be a negative terminal of the capacitor C) may be connected to the node B. The controller may be connected to the first switching transistor S1, the second switching transistor S2, the third switching transistor S3, and the fourth switching transistor S4.

It can be learned from the foregoing connection relationship that the bidirectional direct current converter provided in this embodiment of this disclosure is a three-level direct current converter, and three levels are implemented by using a topology of the bidirectional direct current converter. In addition, voltage stress of a power device may be reduced, so that a high-level voltage output can be implemented by using a power device with a low withstand voltage level.

Optionally, the controller may be configured to perform complementary control on the first switching transistor S1 and the third switching transistor S3, and perform complementary control on the second switching transistor S2 and the fourth switching transistor S4.

The complementary control is used to indicate that two switching transistors in complementary control cannot be simultaneously turned on or off. For example, the first switching transistor S1 and the third switching transistor S3 cannot be simultaneously turned on or off, and the second switching transistor S2 and the fourth switching transistor S4 cannot be simultaneously turned on or off.

That is, the controller may control the first switching transistor S1 and the third switching transistor S3 not to be simultaneously turned on or off, and the controller may further control the second switching transistor S2 and the fourth switching transistor S4 not to be simultaneously turned on or off.

Further, the controller may be further configured to control a quantity of on times of the second switching transistor S2 to be greater than a quantity of on times of the first switching transistor S1 in a same cycle. It may also be understood as that, in one cycle, the controller may control a switching frequency of the second switching transistor S2 to be greater than a switching frequency of the first switching transistor S1, thereby reducing losses of the first switching transistor S1 and the second switching transistor S2.

In this embodiment of this disclosure, the controller may control the quantity of on times of the second switching transistor to be different from the quantity of on times of the first switching transistor in a same cycle. This can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, in any cycle of the first switching transistor S1, there may be a delay between an on moment of the first switching transistor S1 and an on moment of the second switching transistor S2. That is, the first switching transistor S1 and the second switching transistor S2 are not simultaneously turned on in any cycle.

Further, a cycle of the first switching transistor S1 may be the same as a cycle of the third switching transistor S3.

In a possible implementation, the controller may be further configured to control a quantity of on times of the fourth switching transistor S4 to be greater than a quantity of on times of the third switching transistor S3 in a same cycle. It may also be understood as that, in one cycle, the controller may control a switching frequency of the fourth switching transistor S4 to be greater than a switching frequency of the third switching transistor S3, thereby reducing losses of the fourth switching transistor S4 and the third switching transistor S3.

It may be understood that the controller controls the quantity of on times of the fourth switching transistor to be different from the quantity of on times of the third switching transistor in a same cycle. Similarly, this can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, the controller may send a first drive signal (which may be represented by PWM1) to the first switching transistor S1, send a second drive signal (which may be represented by PWM2) to the second switching transistor S2, send a third drive signal (which may be represented by PWM3) to the third switching transistor S3, and send a fourth drive signal (which may be represented by PWM4) to the fourth switching transistor S4.

Optionally, a cycle (namely, each cycle) of the first drive signal PWM1 and a cycle (namely, each cycle) of the third drive signal PWM3 are the same, and may be both represented by $T_{sw}$ (that is, $T_{sw}$ represents the cycle of the first drive signal PWM1 or the third drive signal PWM3).

The second drive signal PWM2 may have N drive pulses in each cycle of the first drive signal PWM1, that is, the second drive signal PWM2 and the first drive signal PWM1 are two asymmetric drive signals.

Similarly, the fourth drive signal PWM4 may also have N drive pulses in each cycle of the third drive signal PWM3, that is, the fourth drive signal PWM4 and the third drive signal PWM3 are two asymmetric drive signals.

Because the second drive signal PWM2 may have N drive pulses in each cycle of the first drive signal PWM1, a cycle of the second drive signal PWM2 is different from the cycle of the first drive signal PWM1. Similarly, because the fourth drive signal PWM4 may also have N drive pulses in each cycle of the third drive signal PWM3, a cycle of the fourth drive signal PWM4 is also different from the cycle of the third drive signal PWM3.

Optionally, the controller sends the first drive signal PWM1 to the first switching transistor S1, to control on and off of the first switching transistor S1. It may be understood that the first drive signal PWM1 may be used to indicate the first switching transistor S1 to be turned on, or the first drive signal PWM1 may be used to indicate the first switching transistor S1 to be turned off.

Similarly, the controller sends the second drive signal PWM2 to the second switching transistor S2, to control on and off of the second switching transistor S2. It may be understood that the second drive signal PWM2 may be used to indicate the second switching transistor S2 to be turned on, or the second drive signal PWM2 may be used to indicate the second switching transistor S2 to be turned off.

The controller sends the third drive signal PWM3 to the third switching transistor S3, to control on and off of the third switching transistor S3. It may be understood that the third drive signal PWM3 may be used to indicate the third switching transistor S3 to be turned on, or the third drive signal PWM3 may be used to indicate the third switching transistor S3 to be turned off.

The controller sends the fourth drive signal PWM4 to the fourth switching transistor S4, to control on and off of the fourth switching transistor S4. It may be understood that the fourth drive signal PWM4 may be used to indicate the fourth switching transistor S4 to be turned on, or the fourth drive signal PWM4 may be used to indicate the fourth switching transistor S4 to be turned off.

The inductor L has N+1 charging and discharging cycles in each cycle (namely, $T_{sw}$) of the first drive signal PWM1 or the third drive signal PWM3, where N may be an integer greater than or equal to 2. A value of N is not limited in this embodiment of this disclosure.

Therefore, the inductor L has at least three charging and discharging cycles in each cycle $T_{sw}$. The controller increases a charging and discharging frequency of the inductor L in each cycle $T_{sw}$ (namely, frequency increase), thereby reducing the inductance of the inductor L, and reducing the size and the costs of the inductor L.

For example, when N is equal to 2, the inductor L may have three charging and discharging cycles in each cycle $T_{sw}$, and when N is equal to 3, the inductor L may have four charging and discharging cycles in each cycle $T_{sw}$.

For ease of description, the following uses N=2 as an example for detailed description.

Figure 2:
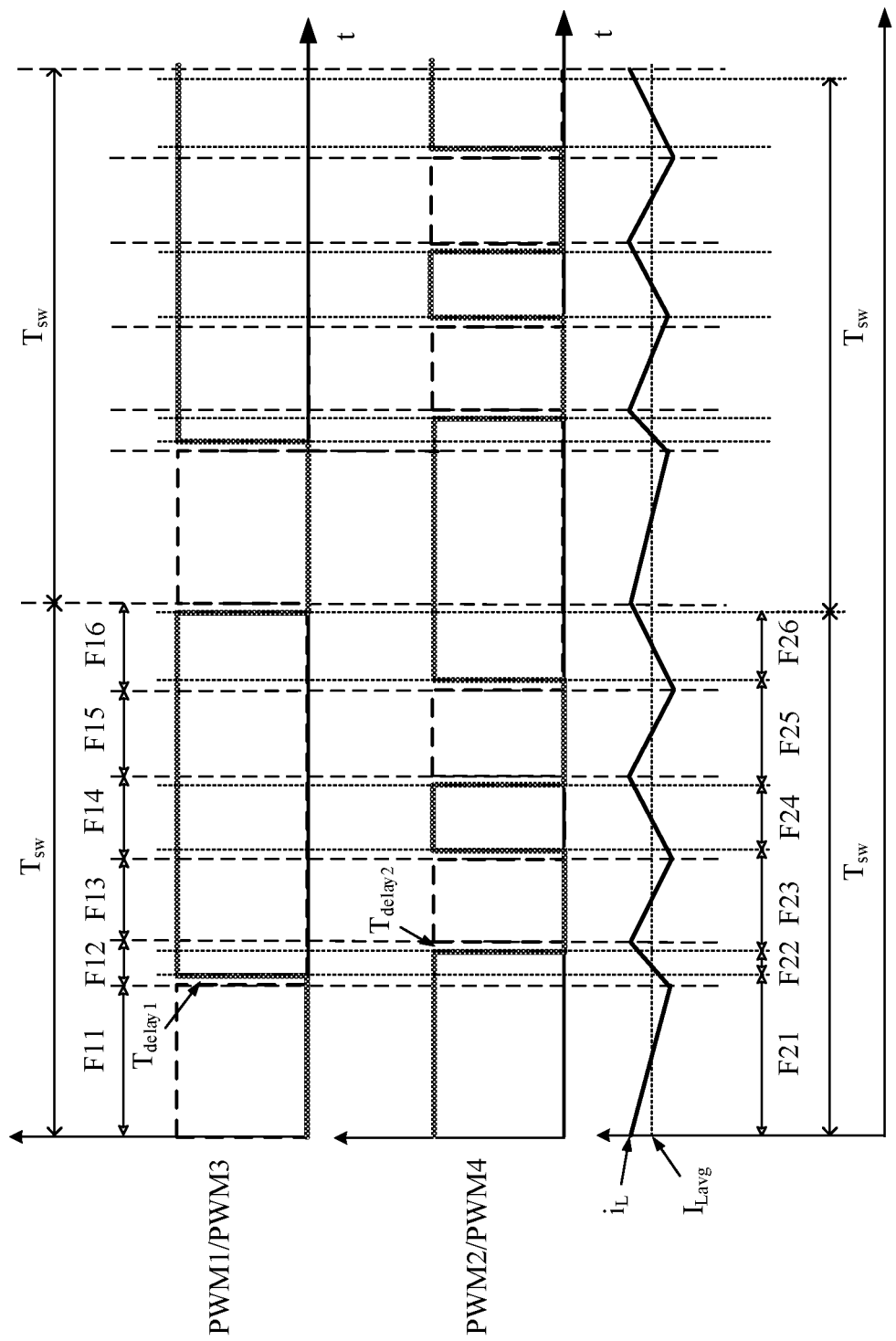
FIG. 2 is a schematic diagram of waveforms of asymmetric drive signals according to an embodiment of this disclosure.

FIG. 2 is a schematic diagram of waveforms of four drive signals (namely, the first drive signal PWM1 (dashed line), the second drive signal PWM2 (dashed line), the third drive signal PWM3 (solid line), and the fourth drive signal PWM4 (solid line)). In FIG. 2, $i_L$ represents an actual current (solid line) of the inductor L, and $I_{Lavg}$ may represent an average current (dashed line) of the inductor L.

Optionally, when the first drive signal PWM1 is at a high level, the first switching transistor S1 may be turned on, and when the first drive signal PWM1 is at a low level, the first switching transistor S1 may be turned off.

Similarly, when the third drive signal PWM3 is at a high level, the third switching transistor S3 may be turned on, and when the third drive signal PWM3 is at a low level, the third switching transistor S3 may be turned off.

It may be understood that the first drive signal PWM1 may be complementary to the third drive signal PWM3. That is, when the first drive signal PWM1 is at a high level, the third drive signal PWM3 may be at a low level. Similarly, when the first drive signal PWM1 is at a low level, the third drive signal PWM3 may be at a high level.

It should be noted that there is a delay interval (namely, $T_{delay1}$ in FIG. 2) between a falling edge of the first drive signal PWM1 and a rising edge of the third drive signal PWM3. That is, in a range of the delay interval $T_{delay1}$, the first switching transistor S1 and the third switching transistor S3 are simultaneously turned off.

Optionally, when the second drive signal PWM2 is at a high level, the second switching transistor S2 may be turned on, and when the second drive signal PWM2 is at a low level, the second switching transistor S2 may be turned off.

Similarly, when the fourth drive signal PWM2 is at a high level, the fourth switching transistor S4 may be turned on, and when the fourth drive signal PWM4 is at a low level, the fourth switching transistor S4 may be turned off.

It may be understood that the second drive signal PWM2 may be complementary to the fourth drive signal PWM4. That is, when the second drive signal PWM2 is at a high level, the fourth drive signal PWM4 may be at a low level. Similarly, when the second drive signal PWM2 is at a low level, the fourth drive signal PWM4 may be at a high level.

It should be noted that there is also a delay interval (namely, $T_{delay2}$ in FIG. 2) between a falling edge of a first drive pulse of the N drive pulses in the fourth drive signal PWM4 and a rising edge of a first drive pulse of the N drive pulses in the second drive signal PWM2. In a range of the delay interval $T_{delay2}$, the second switching transistor S2 and the fourth switching transistor S4 are simultaneously turned off.

In a possible implementation, in any cycle of the first switching transistor S1, there may be a delay between the on moment of the first switching transistor S1 and the on moment of the second switching transistor S2. Therefore, in each cycle of the first drive signal PWM1, the rising edge of the first drive pulse of the N drive pulses in the second drive signal PWM2 may be behind the falling edge of the first drive signal PWM1. That is, there is a delay time (namely, a delay) between a first drive pulse of two drive pulses in the second drive signal PWM2 and the first drive signal PWM1.

Similarly, in each cycle of the third drive signal PWM3, a rising edge of the first drive pulse of the N drive pulses in the fourth drive signal PWM4 may be in front of a falling edge of the third drive signal PWM3. That is, there is a delay between a first drive pulse of two drive pulses in the fourth drive signal PWM4 and the third drive signal PWM3.

In the following, the third direct current terminal DC3 and the fourth direct current terminal DC4 in FIG. 1 are used as the input terminal of the bidirectional direct current converter, and the first direct current terminal DC1 and the second direct current terminal DC2 are used as the output terminal of the bidirectional direct current converter, to describe a control process of the controller for the four switching transistors. When the bidirectional direct current converter performs reverse working, the bidirectional direct current converter is a buck converter.

In FIG. 2, a time period F11, a time period F12, a time period F13, a time period F14, a time period F15, and a time period F16 are different time periods of one cycle $T_{sw}$ of the first drive signal PWM1. The six time periods (namely, the time period F11, the time period F12, the time period F13, the time period F14, the time period F15, and the time period F16) constitute one cycle $T_{sw}$ of the first drive signal PWM1.

It can be seen from FIG. 2 that, in each cycle of the first drive signal PWM1, a rising edge of the first drive pulse of the two drive pulses in the second drive signal PWM2 may be behind the falling edge of the first drive signal PWM1. That is, there is a delay time (namely, a delay) between the first drive pulse of the two drive pulses in the second drive signal PWM2 and the first drive signal PWM1.

Optionally, the second drive signal PWM2 may have two drive pulses in each cycle $T_{sw}$ of the first drive signal PWM1, and the second drive signal PWM2 has two drive pulses in low level time periods of each cycle $T_{sw}$ of the first drive signal PWM1. Therefore, in one cycle $T_{sw}$ of the first drive signal PWM1, the inductor L has three charging and discharging cycles in total, that is, the inductor L completes three times of charging and discharging in one cycle $T_{sw}$ of the first drive signal PWM1. This increases the charging and discharging frequency of the inductor L.

One cycle $T_{sw}$ of the first drive signal PWM1 may be used as an example. The time period F11 is a high level time period of the first drive signal PWM1, and the time period F12, the time period F13, the time period F14, the time period F15, and the time period F16 each are a low level time period of the first drive signal PWM1.

The second drive signal PWM2 has drive pulses in the time period F13 and the time period F15, that is, the second drive signal PWM2 is at a high level in the time period F13 and the time period F15. The second drive signal PWM2 does not have a drive pulse in the time period F11, the time period F12, the time period F14, and the time period F16, that is, the second drive signal PWM2 is at a low level in the time period F11, the time period F12, the time period F14, and the time period F16.

That is, the second drive signal PWM2 has two drive pulses in the low level time periods of one cycle $T_{sw}$ of the first drive signal PWM1, that is, a drive pulse corresponding to the time period F13 and a drive pulse corresponding to the time period F15. Therefore, the inductor L completes charging and discharging in the time period F11 and the time period F12 for the first time, completes charging and discharging in the time period F13 and the time period F14 for the second time, and completes charging and discharging in the time period F15 and the time period F16 for the third time. It can be learned that the inductor L completes charging and discharging for three times in total. This increases the charging and discharging frequency of the inductor L in one cycle $T_{sw}$ of the first drive signal PWM1, and further reduces a ripple current in the inductor L.

The following describes in detail, with reference to FIG. 2, that the controller controls the second drive signal PWM2 to have two drive pulses in the low level time periods of each cycle $T_{sw}$ of the first drive signal PWM1 to increase the charging and discharging frequency of the inductor L.

For ease of description, the following uses one cycle $T_{sw}$ of the first drive signal PWM1 as an example to describe a charging and discharging process of the inductor L.

As shown in FIG. 2, in the time period F11, the first drive signal PWM1 is at a high level, and the second drive signal PWM2 is at a low level. To be specific, the controller may control the first switching transistor S1 to be turned on and control the second switching transistor S2 to be turned off, so that the inductor L is discharged, and $i_L$ gradually decreases. In the time period F12, both the first drive signal PWM1 and the second drive signal PWM2 are at a low level. To be specific, the controller may control both the first switching transistor S1 and the second switching transistor S2 to be turned off, so that the inductor L is charged, and $i_L$ gradually increases. In this case, the inductor L completes charging and discharging for the first time.

In the time period F13, the first drive signal PWM1 is at a low level, and the second drive signal PWM2 is at a high level. To be specific, the controller may control the first switching transistor S1 to be turned off and control the second switching transistor S2 to be turned on, so that the inductor L is discharged, and $i_L$ gradually decreases. In the time period F14, both the first drive signal PWM1 and the second drive signal PWM2 are at a low level. To be specific, the controller may control both the first switching transistor S1 and the second switching transistor S2 to be turned off, so that the inductor L is charged, and $i_L$ gradually increases. In this case, the inductor L completes charging and discharging for the second time.

In the time period F15, the first drive signal PWM1 is at a low level, and the second drive signal PWM2 is at a high level. To be specific, the controller may control the first switching transistor S1 to be turned off and control the second switching transistor S2 to be turned on, so that the inductor L is discharged, and $i_L$ gradually decreases. In the time period F16, both the first drive signal PWM1 and the second drive signal PWM2 are at a low level. To be specific, the controller may control both the first switching transistor S1 and the second switching transistor S2 to be turned off, so that the inductor L is charged, and $i_L$ gradually increases. In this case, the inductor L completes charging and discharging for the third time.

Therefore, the inductor L completes charging and discharging for three times in total in one cycle $T_{sw}$ of the first drive signal PWM1.

The controller sends the first drive signal PWM1 and the second drive signal PWM2 that are asymmetric to the first switching transistor S1 and the second switching transistor S2, to increase the quantity of charging and discharging times of the inductor L in each cycle of the first drive signal PWM1, that is, increase the charging and discharging frequency of the inductor L. Therefore, the inductor with a small inductance may be used while a same ripple current percentage of the inductor L is ensured. In addition, the inductor with a small inductance has a small size and low costs. This can reduce a size and costs of the bidirectional direct current converter.

Still refer to FIG. 2. A time period F21, a time period F22, a time period F23, a time period F24, a time period F25, and a time period F26 are different time periods of one cycle $T_{sw}$ of the third drive signal PWM3. The six time periods (namely, the time period F21, the time period F22, the time period F23, the time period F24, the time period F25, and the time period F26) constitute one cycle $T_{sw}$ of the third drive signal PWM3.

It can be further seen from FIG. 2 that, in each cycle of the third drive signal PWM3, a rising edge of the first drive pulse of the two drive pulses in the fourth drive signal PWM4 may be in front of the falling edge of the third drive signal PWM3. That is, there is also a delay between the first drive pulse of the two drive pulses in the fourth drive signal PWM4 and the third drive signal PWM3.

Optionally, the fourth drive signal PWM4 may have two drive pulses in each cycle $T_{sw}$ of the third drive signal PWM3. One of the two drive pulses in the fourth drive signal PWM4 (namely, a first part of drive pulses in a plurality of drive pulses in the fourth drive signal PWM4) is in a low level time period of each cycle $T_{sw}$ of the third drive signal PWM3, and the other of the two drive pulses in the fourth drive signal PWM4 (namely, a second part of drive pulses in the plurality of drive pulses in the fourth drive signal PWM4) is in a high level time period of each cycle $T_{sw}$ of the third drive signal PWM3. Therefore, in one cycle $T_{sw}$ of the third drive signal PWM3, the inductor L has three charging and discharging cycles in total, that is, the inductor L completes three times of charging and discharging in one cycle $T_{sw}$ of the third drive signal PWM3. Similarly, this can increase the charging and discharging frequency of the inductor L.

One cycle $T_{sw}$ of the third drive signal PWM3 may be used as an example. The time period F21 is a low level time period of the third drive signal PWM3, and the time period F22, the time period F23, the time period F24, the time period F25, and the time period F26 each are a high level time period of the third drive signal PWM3.

The fourth drive signal PWM4 has drive pulses in the time period F21, the time period F22, the time period F24, and the time period F26, that is, the fourth drive signal PWM4 is at a high level in the time period F21, the time period F22, the time period F24, and the time period F26. The fourth drive signal PWM4 does not have a drive pulse in the time period F23 and the time period F25, that is, the fourth drive signal PWM4 is at a low level in the time period F23 and the time period F25.

That is, the fourth drive signal PWM4 has one drive pulse in a low level time period of one cycle $T_{sw}$ of the third drive signal PWM3, namely, a drive pulse corresponding to the time period F21. In addition, the fourth drive signal PWM4 has two drive pulses in high level time periods of one cycle $T_{sw}$ of the third drive signal PWM3, namely, a drive pulse corresponding to the time period F24 and a drive pulse corresponding to the time period F26.

Therefore, the inductor L completes charging and discharging in the time period F21 to the time period F23 for the first time, completes charging and discharging in the time period F24 and the time period F26 for the second time, and completes charging and discharging in the time period F26 for the third time. It can be learned that the inductor L completes charging and discharging for three times in total. This increases the charging and discharging frequency of the inductor L in one cycle $T_{sw}$ of the third drive signal PWM3, and further reduces a ripple current in the inductor L.

The following describes in detail, with reference to FIG. 1, that the controller controls the fourth drive signal PWM4 to have one drive pulse in the low level time period and two drive pulses in the high level time periods of each cycle $T_{sw}$ of the third drive signal PWM3 to increase the charging and discharging frequency of the inductor L.

For ease of description, the following uses one cycle $T_{sw}$ of the third drive signal PWM3 as an example to describe a charging and discharging process of the inductor L.

As shown in FIG. 2, in the time period F21, the third drive signal PWM3 is at a low level, and the fourth drive signal PWM4 is at a high level. To be specific, the controller may control the third switching transistor S3 to be turned off and control the fourth switching transistor S4 to be turned on, so that the inductor L is discharged, and $i_L$ gradually decreases. In the time period F22, both the third drive signal PWM3 and the fourth drive signal PWM4 are at a high level. To be specific, the controller may control both the third switching transistor S3 and the fourth switching transistor S4 to be turned on, so that the inductor L is charged, and $i_L$ gradually increases. In this case, the inductor L completes charging and discharging for the first time.

In the time period F23, the third drive signal PWM3 is at a high level, and the fourth drive signal PWM4 is at a low level. To be specific, the controller may control the third switching transistor S3 to be turned on and control the fourth switching transistor S4 to be turned off, so that the inductor L is discharged, and $i_L$ gradually decreases. In the time period F24, both the third drive signal PWM3 and the fourth drive signal PWM4 are at a high level. To be specific, the controller may control both the third switching transistor S3 and the fourth switching transistor S4 to be turned on, so that the inductor L is charged, and $i_L$ gradually increases. In this case, the inductor L completes charging and discharging for the second time.

In the time period F25, the third drive signal PWM3 is at a high level, and the fourth drive signal PWM4 is at a low level. To be specific, the controller may control the third switching transistor S3 to be turned on and control the fourth switching transistor S4 to be turned off, so that the inductor L is discharged, and $i_L$ gradually decreases. In the time period F26, both the third drive signal PWM3 and the fourth drive signal PWM4 are at a high level. To be specific, the controller may control both the third switching transistor S3 and the fourth switching transistor S4 to be turned on, so that the inductor L is charged, and $i_L$ gradually increases. In this case, the inductor L completes charging and discharging for the third time.

Therefore, the inductor L completes charging and discharging for three times in total in one cycle $T_{sw}$ of the third drive signal PWM3.

The controller sends the third drive signal PWM3 and the fourth drive signal PWM4 that are asymmetric to the third switching transistor S3 and the fourth switching transistor S4, to increase the quantity of charging and discharging times of the inductor L in each cycle of the third drive signal PWM3, that is, increase the charging and discharging frequency of the inductor L. Therefore, the inductor with a small inductance may be used while a same ripple current percentage of the inductor L is ensured. In addition, the inductor with a small inductance has a small size and low costs. This can reduce a size and costs of the bidirectional direct current converter.

In the bidirectional direct current converter provided in this embodiment of this disclosure, the controller can send the asymmetric drive signals to the first switching transistor and the second switching transistor, and send the asymmetric drive signals to the third switching transistor and the fourth switching transistor. This increases the charging and discharging frequency of the inductor, thereby reducing the costs of the inductor, and further reducing the size and the costs of the bidirectional direct current converter. When the size of the bidirectional direct current converter is reduced, power density of the bidirectional direct current converter can be increased.

In addition, in this embodiment of this disclosure, the asymmetric drive signals are sent to the first switching transistor and the second switching transistor, and the asymmetric drive signals are sent to the third switching transistor and the fourth switching transistor, so that a state of the first switching transistor is opposite to a state of the third switching transistor (that is, the first switching transistor is complementary to the third switching transistor), and a state of the second switching transistor is opposite to a state of the fourth switching transistor (that is, the second switching transistor is complementary to the fourth switching transistor). Further, current sharing or complement is implemented between a branch in which the first switching transistor and the second switching transistor are located and a branch in which the third switching transistor and the fourth switching transistor are located (that is, between two branches), so that a voltage of the capacitor remains stable.

Figure 3:
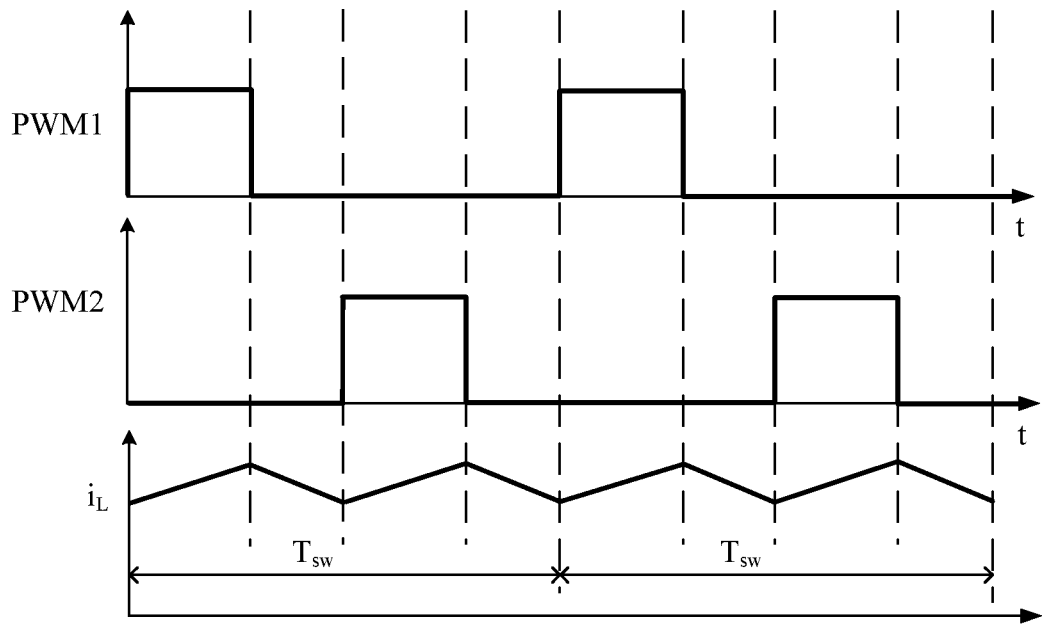
FIG. 3 is a schematic diagram of waveforms of symmetric drive signals according to an embodiment of this disclosure.
Figure 4:
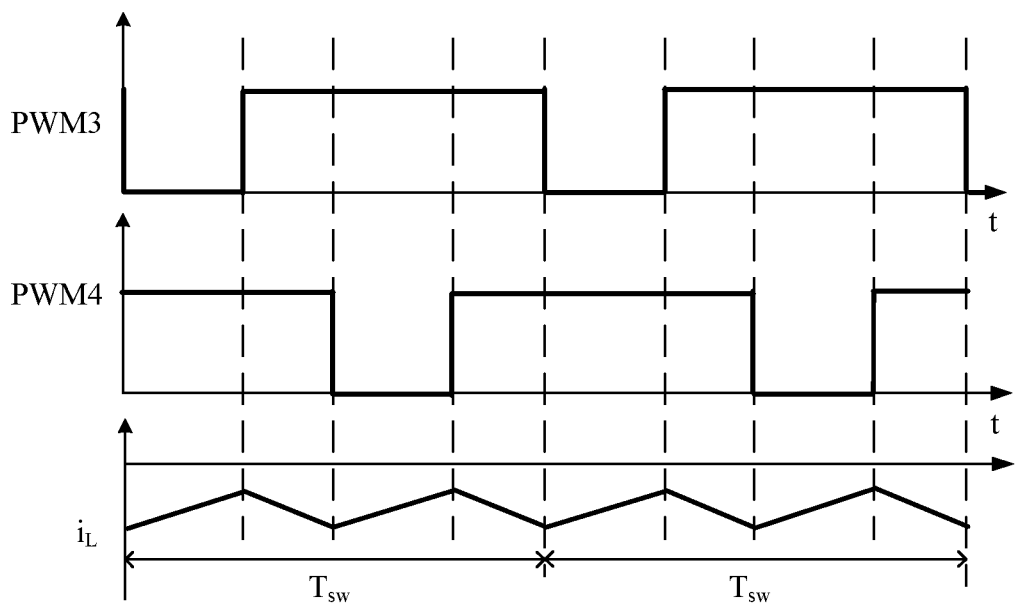
FIG. 4 is a schematic diagram of waveforms of symmetric drive signals according to an embodiment of this disclosure.

To verify advantages of the asymmetric drive signals shown in FIG. 2, the following performs description with reference to diagrams of waveforms of symmetric drive signals provided in FIG. 3 and FIG. 4.

When the bidirectional direct current converter shown in FIG. 1 performs forward working (to be specific, the first direct current terminal DC1 and the second direct current terminal DC2 are used as the input terminal of the bidirectional direct current converter, and the third direct current terminal DC3 and the fourth direct current terminal DC4 are used as the output terminal of the bidirectional direct current converter), the bidirectional direct current converter is a boost converter. Therefore, the third switching transistor S3 and the fourth switching transistor S4 in the bidirectional direct current converter shown in FIG. 1 may be separately equivalent to a diode. In this case, the controller may send drive signals to only the first switching transistor S1 and the second switching transistor S2.

A diagram of waveforms of the first drive signal PWM1 sent by the controller to the first switching transistor S1 and the second drive signal PWM2 sent by the controller to the second switching transistor S2 is shown in FIG. 3. It can be seen from FIG. 3 that the first drive signal PWM1 and the second drive signal PWM2 are symmetric, that is, cycles of the two drive signals are the same, and duty cycles are also the same.

It can be seen from FIG. 3 that, in one cycle $T_{sw}$ of the first drive signal PWM1, the first drive signal PWM1 may have one drive pulse, the second drive signal PWM2 may also have one drive pulse, and the inductor L may perform charging and discharging for two times. $i_L$ has two cycles. To be specific, when the first drive signal PWM1 or the second drive signal PWM2 is at a high level, the inductor L is charged, and $i_L$ gradually increases, and when the first drive signal PWM1 or the second drive signal PWM2 is at a low level, the inductor L is discharged, and $i_L$ gradually decreases.

However, in FIG. 2, the first drive signal PWM1 and the second drive signal PWM2 are asymmetric drive signals. In one cycle $T_{sw}$ of the first drive signal PWM1, the first drive signal PWM1 has one drive pulse, the second drive signal PWM2 has at least two drive pulses, and the inductor L performs charging and discharging for at least three times.

It can be learned from comparison between FIG. 2 and FIG. 3 that, in this embodiment of this disclosure, the asymmetric drive signals can be used to increase a frequency of one (namely, the second drive signal) of the drive signals, thereby increasing the charging and discharging frequency of the inductor L and reducing the inductance of the inductor.

When the bidirectional direct current converter shown in FIG. 1 performs reverse working (to be specific, the third direct current terminal DC3 and the fourth direct current terminal DC4 are used as the input terminal of the bidirectional direct current converter, and the first direct current terminal DC1 and the second direct current terminal DC2 are used as the output terminal of the bidirectional direct current converter), the bidirectional direct current converter is a buck converter. Therefore, the first switching transistor S1 and the second switching transistor S2 in the bidirectional direct current converter shown in FIG. 1 may be separately equivalent to a diode. In this case, the controller may send drive signals to only the third switching transistor S3 and the fourth switching transistor S4.

A diagram of waveforms of the third drive signal PWM3 sent by the controller to the third switching transistor S3 and the fourth drive signal PWM4 sent by the controller to the fourth switching transistor S4 is shown in FIG. 4. It can be seen from FIG. 4 that the third drive signal PWM3 and the fourth drive signal PWM4 are symmetric, that is, cycles of the two drive signals are the same, and duty cycles are also the same.

It can be seen from FIG. 4 that, in one cycle $T_{sw}$ of the third drive signal PWM3, the third drive signal PWM3 may have one drive pulse, and the fourth drive signal PWM4 may also have one drive pulse. $i_L$ has two cycles. To be specific, the inductor L may perform two times of charging and discharging as follows. When the third drive signal PWM3 is at a low level and the fourth drive signal PWM4 is at a high level, the inductor L is charged for the first time and $i_L$ gradually increases, when both the third drive signal PWM3 and the fourth drive signal are at a high level, the inductor L is discharged for the first time and $i_L$ gradually decreases, and the inductor L completes charging and discharging for the first time, and when the third drive signal is at a high level and the fourth drive signal PWM4 is at a low level, the inductor L is charged for the second time and $i_L$ gradually increases, when the third drive signal is at a low level and the fourth drive signal PWM4 is at a low level, the inductor L is discharged for the second time and $i_L$ gradually decreases, and the inductor L completes charging and discharging for the second time.

It can be learned from comparison between FIG. 2 and FIG. 4 that, in this embodiment of this disclosure, the asymmetric drive signals can be used to increase a frequency of one (namely, the fourth drive signal) of the drive signals, thereby increasing the charging and discharging frequency of the inductor L and reducing the inductance of the inductor.

The foregoing describes that the controller sends the asymmetric drive signals to the first switching transistor S1 and the second switching transistor S2, and sends the asymmetric drive signals to the third switching transistor S3 and the fourth switching transistor S4, to reduce the inductance of the inductor L, thereby reducing the size and the costs of the inductor L, and further reducing the size and the costs of the entire bidirectional direct current converter.

Optionally, the first switching transistor S1, the second switching transistor S2, the third switching transistor S3, and the fourth switching transistor S4 in FIG. 1 may separately use an insulated gate field-effect transistor (or metal-oxide-semiconductor field-effect transistor (MOSFET) or MOS transistor), an insulated-gate bipolar transistor (IGBT), a bidirectional switch, or the like. Certainly, the four switching transistors each may alternatively use another controllable power device. This is not limited in this embodiment of this disclosure.

In a possible implementation, the N drive pulses in the second drive signal PWM2 may exist in each cycle of the first drive signal PWM1 in the following three manners:

Manner 1: All the N drive pulses in the second drive signal PWM2 may be in low level time periods of each cycle of the first drive signal PWM1.

Manner 2: All the N drive pulses in the second drive signal PWM2 may be in high level time periods of each cycle of the first drive signal PWM1.

Manner 3: The N drive pulses in the second drive signal PWM2 may be divided into a first part of drive pulses and a second part of drive pulses. The first part of drive pulses may be in low level time periods of each cycle of the first drive signal PWM1, and the second part of drive pulses may be in high level time periods of each cycle of the first drive signal PWM1.

It should be noted that, in this embodiment of this disclosure, an example in which the two drive pulses in the second drive signal PWM2 are in low level time periods of each cycle of the first drive signal PWM1 (namely, manner 1) is used for description.

In addition, in this embodiment of this disclosure, a quantity of drive pulses that are in the second drive signal PWM2 and that exist in low level time periods of each cycle of the first drive signal PWM1 may be not limited, that is, N may be two or more, for example, three or four.

In another possible implementation, the N drive pulses in the fourth drive signal PWM4 may exist in each cycle of the third drive signal PWM3 in the following three manners:

Manner 1: All the N drive pulses in the fourth drive signal PWM4 may be in low level time periods of each cycle of the third drive signal PWM3.

Manner 2: All the N drive pulses in the fourth drive signal PWM4 may be in high level time periods of each cycle of the third drive signal PWM3.

Manner 3: The N drive pulses in the fourth drive signal may be divided into a first part of drive pulses and a second part of drive pulses. The first part of drive pulses may be in low level time periods of each cycle of the third drive signal PWM3, and the second part of drive pulses may be in high level time periods of each cycle of the third drive signal PWM3.

It should be noted that, in this embodiment of this disclosure, an example in which one drive pulse (namely, the first part of drive pulses in the two drive pulses) in the fourth drive signal PWM4 is in a high level time period of each cycle of the third drive signal PWM3 and one drive pulse (namely, the second part of drive pulses in the two drive pulses) is in a low level time period of each cycle of the third drive signal PWM3 (namely, manner 3) is used for description.

In this embodiment of this disclosure, a quantity of drive pulses that are in the fourth drive signal PWM4 and that exist in low level time periods or high level time periods of each cycle of the third drive signal PWM3 may be not limited.

Because the first drive signal PWM1 is simple, the following describes the second drive signal PWM2 in one cycle $T_{sw}$ of the first drive signal PWM1 and the fourth drive signal PWM4 in one cycle $T_{sw}$ of the third drive signal PWM3.

The second drive signal PWM2 in one cycle $T_{sw}$ of the first drive signal PWM1 is first described in the following three aspects:

According to a first aspect, frequencies corresponding to at least two of the N drive pulses in the second drive signal PWM2 are different.

The following uses an example in which the second drive signal PWM2 has three drive pulses in low level time periods of each cycle $T_{sw}$ of the first drive signal PWM1 for description, that is, frequencies corresponding to two of the three drive pulses are different.

Figure 5:
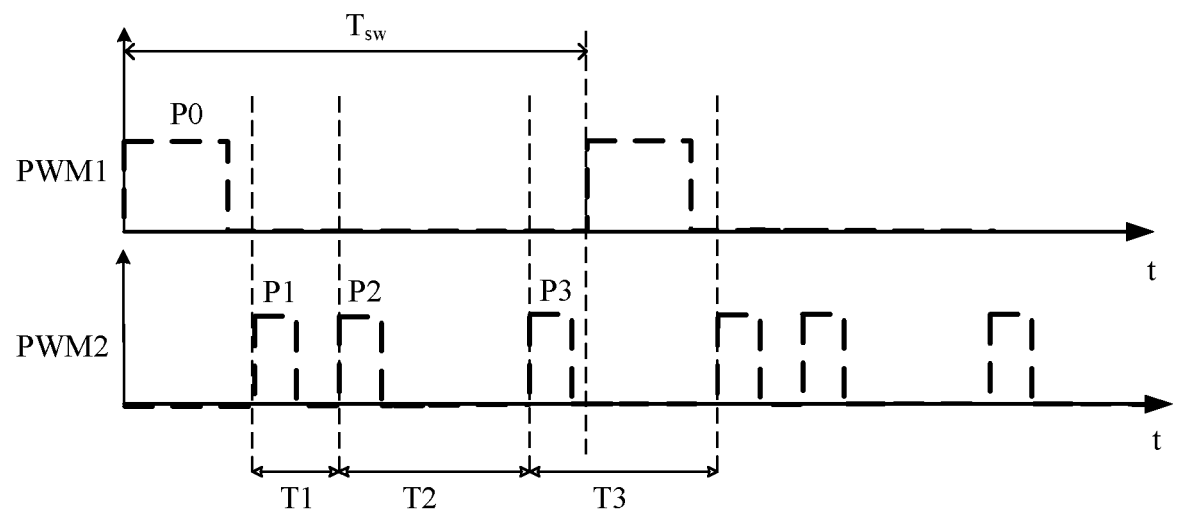
FIG. 5 is a schematic diagram of waveforms of a first drive signal and a second drive signal according to an embodiment of this disclosure.

As shown in FIG. 5, pulse P1 represents a first drive pulse of the three drive pulses that are in the second drive signal PWM2 and that are in the low level time periods of each cycle $T_{sw}$ of the first drive signal PWM1, P2 represents a second drive pulse, and P3 represents a third drive pulse. T1 is a cycle corresponding to the drive pulse P1, T2 is a cycle corresponding to the drive pulse P2, and T3 is a cycle corresponding to the drive pulse P3.

It can be seen from FIG. 5 that the cycle T2 corresponding to the drive pulse P2 and the cycle T3 corresponding to the drive pulse P3 are the same (that is, T2=T3). It can be learned from an inverse relationship between a cycle and a frequency that a frequency (which may be represented by f2) corresponding to the drive pulse P2 is equal to a frequency (which may be represented by f3) corresponding to the drive pulse P3, that is, f2=f3. However, both the cycle T2 corresponding to the drive pulse P2 and the cycle T3 corresponding to the drive pulse P3 are different from the cycle T1 corresponding to the drive pulse P1. Therefore, both the frequency of the drive pulse P2 and the frequency of the drive pulse P3 are different from a frequency of the drive pulse P1. It can be seen from FIG. 5 that T3>T1. Therefore, the frequency corresponding to the drive pulse P3 is less than the frequency (which may be represented by f1) corresponding to the drive pulse P1, that is, f3<f1.

P0 represents a drive pulse of the first drive signal PWM1 in one cycle $T_{sw}$, the drive pulse P0 corresponds to an on time of the first switching transistor S1, and the on time of the first switching transistor S1 may be obtained by multiplying a duty cycle D1 of the first switching transistor S1 by the cycle $T_{sw}$ of the first drive signal PWM1.

Refer to FIG. 5. All pulse widths of the drive pulse P1, the drive pulse P2, and the drive pulse P3 are the same, that is, P1=P2=P3.

Certainly, the three drive pulses that are in the second drive signal PWM2 and that exist in the low level time periods of each cycle $T_{sw}$ of the first drive signal PWM1 may be different.

Figure 6:
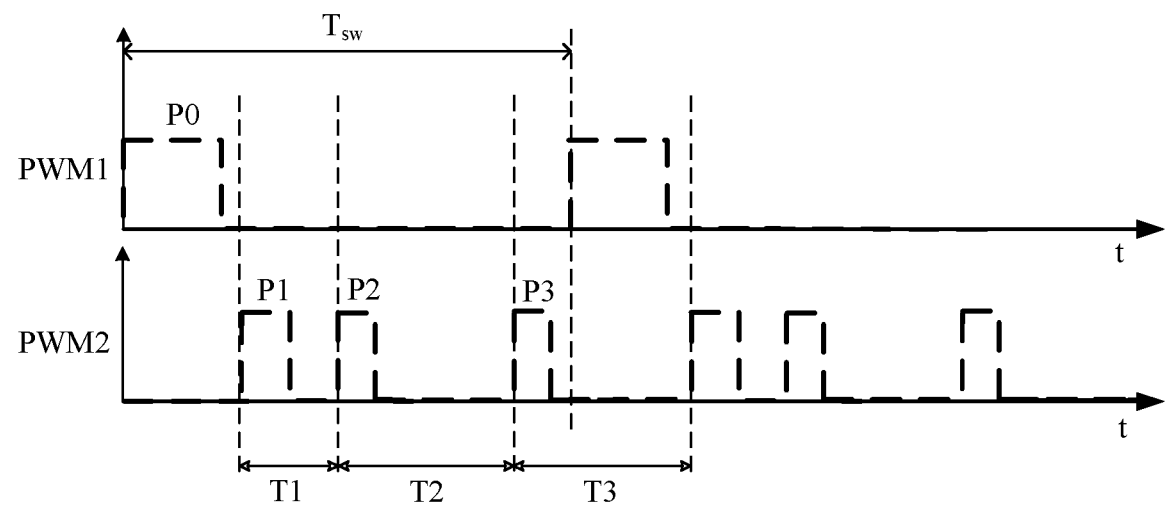
FIG. 6 is a schematic diagram of waveforms of a first drive signal and a second drive signal according to an embodiment of this disclosure.

For example, as shown in FIG. 6, pulse widths of a drive pulse P2 and a drive pulse P3 are the same, and the pulse widths of the drive pulse P2 and the drive pulse P3 are different from a pulse width of a drive pulse P1. It can be seen from FIG. 6 that the pulse width of the drive pulse P1 is greater than the pulse width of the drive pulse P2 (or the drive pulse P3).

Because there may be a plurality of drive pulses (for example, three drive pulses) that are in the second drive signal PWM2 and that are in low level time periods of the first drive signal PWM1, the charging and discharging frequency of the inductor L is increased. Even if the pulse widths of the drive pulses in the second drive signal PWM2 are different (as shown in FIG. 6), the inductance of the inductor L can still be reduced while a same ripple current percentage of the inductor L is ensured, thereby further reducing the size and the costs of the inductor L.

According to a second aspect, a frequency corresponding to each of the N drive pulses in the second drive signal PWM2 is different.

The following describes an implementation form of the second drive signal PWM2 by using an example in which the second drive signal PWM2 has three drive pulses in low level time periods of each cycle of the first drive signal PWM1. That is, when N=3, frequencies corresponding to the three drive pulses are different.

Figure 7:
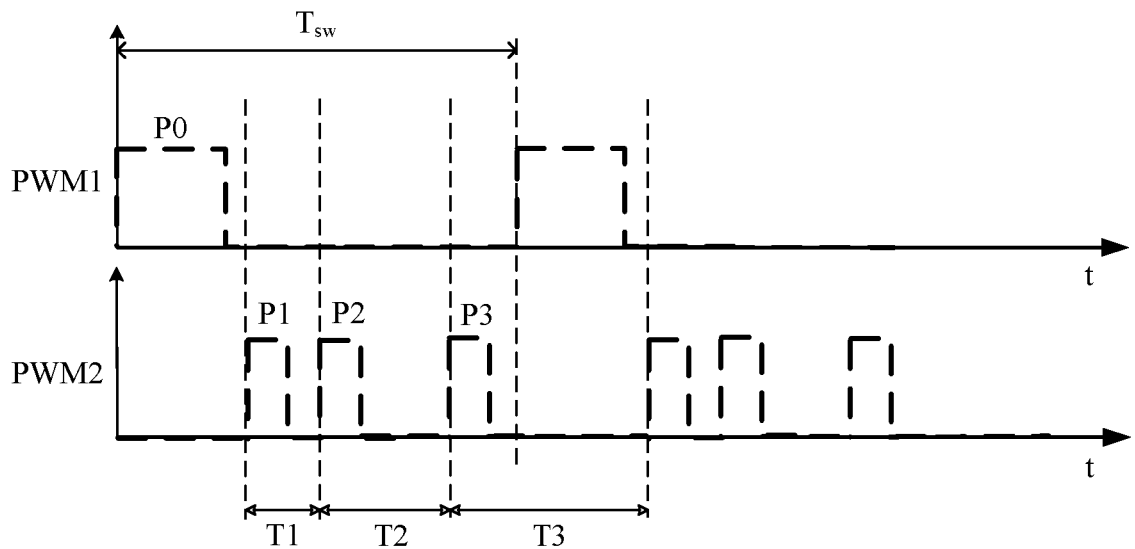
FIG. 7 is a schematic diagram of waveforms of a first drive signal and a second drive signal according to an embodiment of this disclosure.

As shown in FIG. 7, a cycle T3 corresponding to a drive pulse P3 is greater than a cycle T2 corresponding to a drive pulse P2, and the cycle T2 corresponding to the drive pulse P2 is greater than a cycle T1 corresponding to a drive pulse P1, that is, T3>T2>T1. Similarly, it can be learned from an inverse relationship between a cycle and a frequency that a frequency f3 corresponding to the drive pulse P3 is less than a frequency f2 corresponding to the drive pulse P2 (that is, f3<f2), and the frequency f2 corresponding to the drive pulse P2 is less than a frequency f1 corresponding to the drive pulse P1 (that is, f2<f1). That is, all the frequencies corresponding to the drive pulse P1, the drive pulse P2, and the drive pulse P3 are different.

Certainly, pulse widths of the three drive pulses that are in the second drive signal PWM2 and that exist in the low level time periods of each cycle of the first drive signal PWM1 may alternatively be different.

Figure 8:
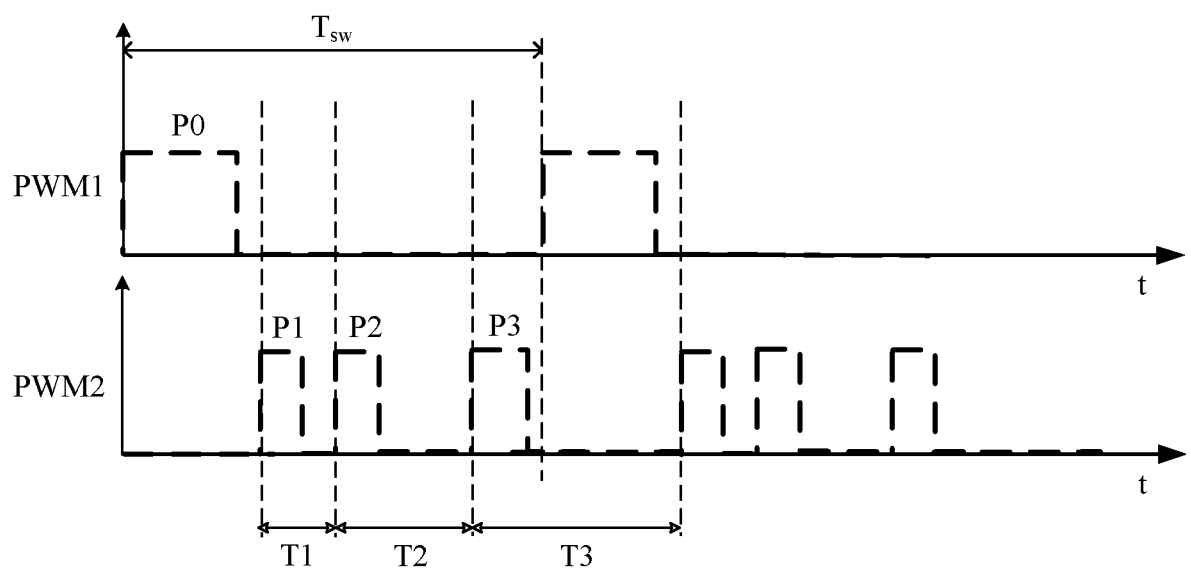
FIG. 8 is a schematic diagram of waveforms of a first drive signal and a second drive signal according to an embodiment of this disclosure.

As shown in FIG. 8, a cycle T3 corresponding to a drive pulse P3 is greater than a cycle T2 corresponding to a drive pulse P2, and the cycle T2 corresponding to the drive pulse P2 is greater than a cycle T1 corresponding to a drive pulse P1, that is, T3>T2>T1. In addition, a pulse width of the drive pulse P1 is equal to a pulse width of the drive pulse P2. However, both the pulse width of the drive pulse P1 and the pulse width of the drive pulse P2 are less than a pulse width of the drive pulse P3.

Figure 9:
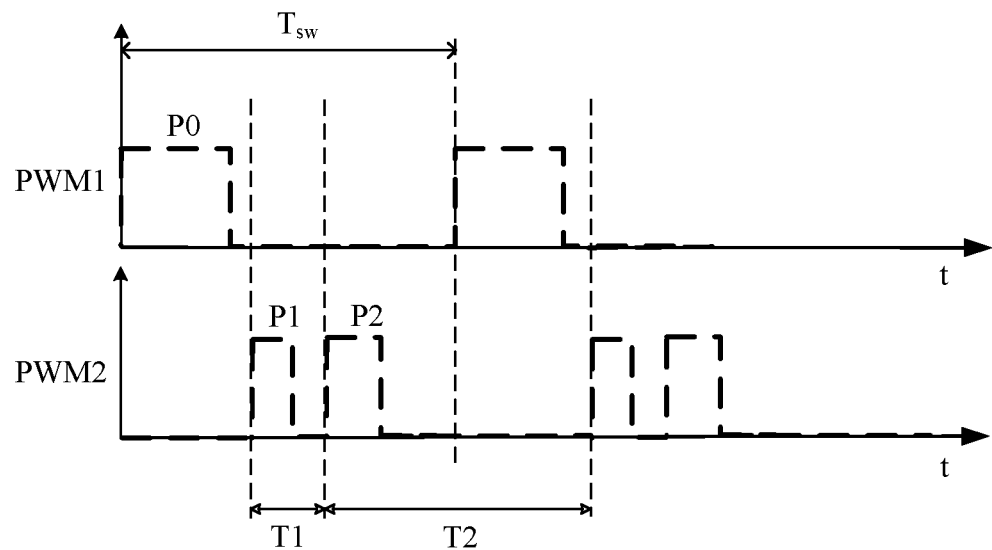
FIG. 9 is a schematic diagram of waveforms of a first drive signal and a second drive signal according to an embodiment of this disclosure.

Similarly, as shown in FIG. 9, the second drive signal PWM2 may have a drive pulse P1 and a drive pulse P2 in low level time periods of each cycle of the first drive signal PWM1, where a cycle T2 corresponding to the drive pulse P2 is greater than a cycle T1 corresponding to the drive pulse P1, that is, T2>T1. In addition, a pulse width of the drive pulse P2 is greater than a pulse width of the drive pulse P1 (that is, the pulse widths of the drive pulse P1 and the drive pulse P2 are different).

It should be noted that the second drive signal PWM2 may have two drive pulses in low level time periods of each cycle of the first drive signal PWM1, and pulse widths of the two drive pulses are the same, as shown in FIG. 2. Details are not described in this embodiment of this disclosure again.

According to a third aspect, frequencies of first N−1 drive pulses of the N drive pulses in the second drive signal PWM2 are the same, and a frequency of a last drive pulse of the N drive pulses in the second drive signal is less than the frequencies of the first N−1 drive pulses.

The following uses an example in which the second drive signal PWM2 has three drive pulses in low level time periods of each cycle of the first drive signal PWM1 for description.

Figure 10:
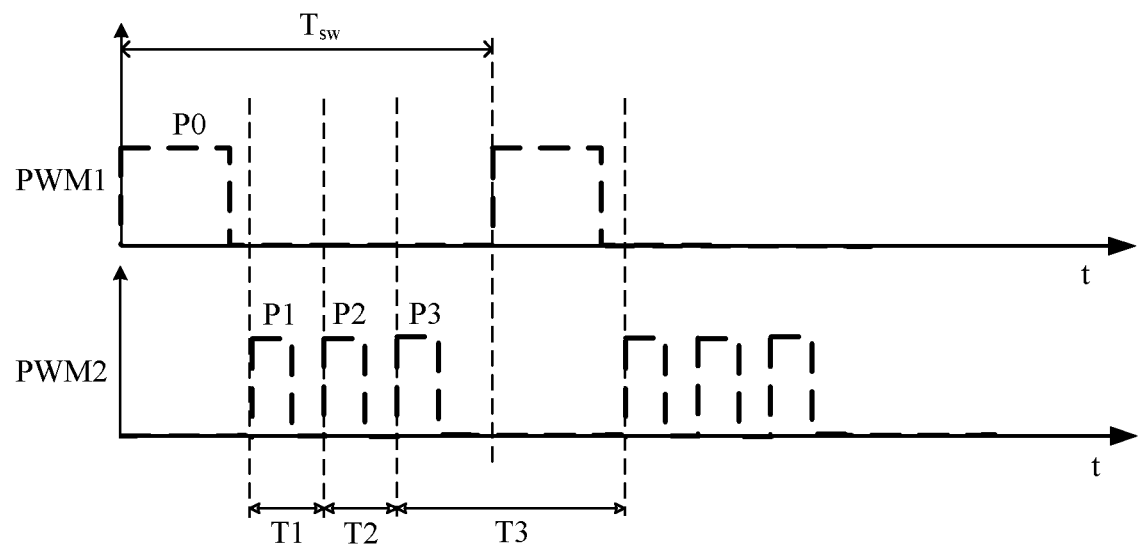
FIG. 10 is a schematic diagram of waveforms of a first drive signal and a second drive signal according to an embodiment of this disclosure.

In an example, as shown in FIG. 10, pulse widths of a drive pulse P1, a drive pulse P2, and a drive pulse P3 are the same, and cycles of the drive pulse P1 and the drive pulse P2 (namely, first two drive pulses) are the same (that is, T1=T2). Therefore, frequencies of the drive pulse P1 and the drive pulse P2 are the same (that is, f1=f2). In addition, a cycle of the drive pulse P3 (namely, a last drive pulse of the three drive pulses) is greater than the cycles of the drive pulse P1 and the drive pulse P2, that is, a frequency of the drive pulse P3 is less than the frequency of the drive pulse P1 (or the drive pulse P2) (that is, f3<f1).

Figure 11:
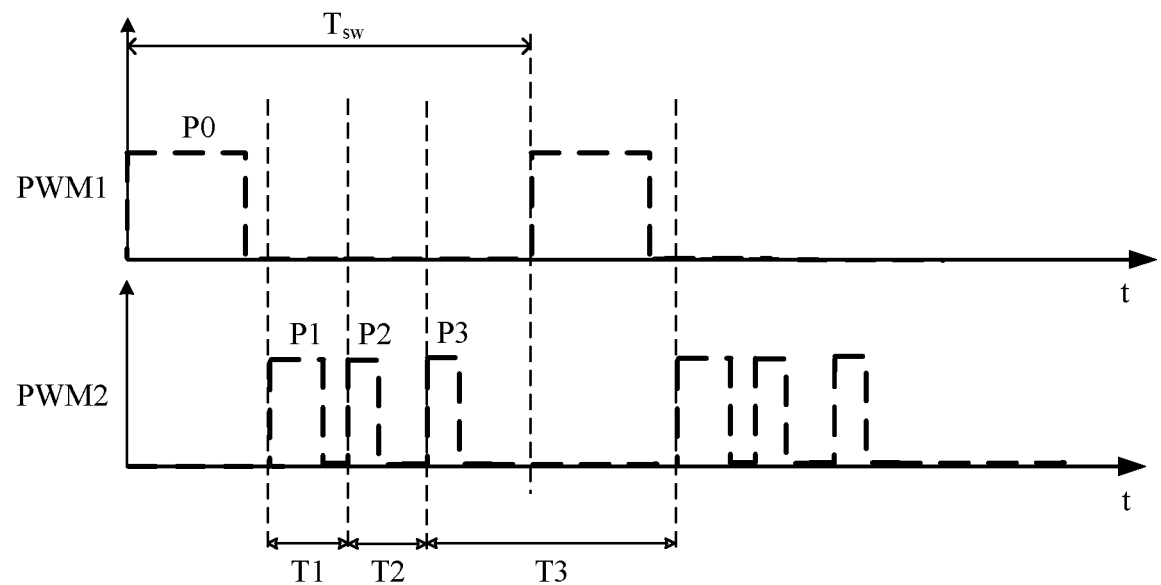
FIG. 11 is a schematic diagram of waveforms of a first drive signal and a second drive signal according to an embodiment of this disclosure.

In another example, as shown in FIG. 11, a pulse width of a drive pulse P1 is greater than a pulse width of a drive pulse P2, and the pulse width of the drive pulse P2 is the same as a pulse width of a drive pulse P3. In addition, cycles of the drive pulse P1 and the drive pulse P2 are the same, that is, T1=T2, that is, frequencies of the drive pulse P1 and the drive pulse P2 are the same (that is, f1=f2). In addition, a cycle of the drive pulse P3 is greater than the cycles of the drive pulse P1 and the drive pulse P2, that is, a frequency of the drive pulse P3 is less than the frequency of the drive pulse P1 (or the drive pulse P2) (that is, f3<f1).

It can be learned from the foregoing three aspects that, in this embodiment of this disclosure, the controller sends the asymmetric drive signals to the first switching transistor S1 and the second switching transistor S2, so that the charging and discharging frequency of the inductor L increases, and the inductance of the inductor L can still be reduced while a same ripple current percentage of the inductor L is ensured, thereby further reducing the size and the costs of the inductor L.

The following describes the fourth drive signal PWM4 in one cycle $T_{sw}$ of the third drive signal PWM3 in the following cases:

According to a first aspect, frequencies corresponding to at least two of the N drive pulses in the fourth drive signal PWM4 are different.

The following uses an example in which the fourth drive signal PWM4 has three drive pulses in each cycle $T_{sw}$ of the third drive signal PWM3 and pulse widths of the three drive pulses are the same for description.

One drive pulse P1 exists in a low level time period of each cycle $T_{sw}$ of the third drive signal PWM3, two drive pulses (namely, a drive pulse P2 and a drive pulse P3) exist in high level time periods of each cycle $T_{sw}$ of the third drive signal PWM3, and all of a pulse width of the drive pulse P1, a pulse width of the drive pulse P2, and a pulse width of the drive pulse P3 are the same. If a cycle T1 corresponding to the drive pulse P1 is the same as a cycle T2 corresponding to the drive pulse P2 (that is, T1=T2), but the cycle T2 corresponding to the drive pulse P2 is different from a cycle T3 corresponding to the drive pulse P3 (that is, T2≠T3), a frequency f1 corresponding to the drive pulse P1 is the same as a frequency f2 corresponding to the drive pulse P2 (that is, f1=f2), and the frequency f2 corresponding to the drive pulse P2 is different from a frequency f3 corresponding to the drive pulse P3 (that is, f2/3).

Certainly, the pulse widths of the three drive pulses that are in the fourth drive signal PWM4 and that exist in each cycle $T_{sw}$ of the third drive signal PWM3 may alternatively be different. For details, refer to the foregoing related descriptions. Details are not described in this embodiment of this disclosure again.

Because there may be a plurality of drive pulses (for example, two drive pulses) that are in the fourth drive signal PWM4 and that are in a low level time period and a high level time period of the third drive signal PWM3, the charging and discharging frequency of the inductor L is also increased. Even if the pulse widths of the drive pulses in the fourth drive signal PWM4 are different, the inductance of the inductor L can still be reduced while a same ripple current percentage of the inductor L is ensured, thereby further reducing the size and the costs of the inductor L.

According to a second aspect, a frequency corresponding to each of the N drive pulses in the fourth drive signal PWM4 is different.

The following uses an example in which the fourth drive signal PWM4 has three drive pulses in each cycle $T_{sw}$ of the third drive signal PWM3, pulse widths of the three drive pulses are the same, and all frequencies corresponding to the three drive pulses are different for description.

One drive pulse P1 exists in a low level time period of each cycle $T_{sw}$ of the third drive signal PWM3, a drive pulse P2 and a drive pulse P3 exist in high level time periods of each cycle $T_{sw}$ of the third drive signal PWM3, and all of a pulse width of the drive pulse P1, a pulse width of the drive pulse P2, and a pulse width of the drive pulse P3 are the same. If all of a cycle T1 corresponding to the drive pulse P1, a cycle T2 corresponding to the drive pulse P2, and a cycle T3 corresponding to the drive pulse P3 are different (that is, T1≠T2≠T3), all of a frequency f1 corresponding to the drive pulse P1, a frequency f2 corresponding to the drive pulse P2, and a frequency f3 corresponding to the drive pulse P3 are different (that is, f1≠f2≠f3).

Certainly, the pulse widths of the three drive pulses that are in the fourth drive signal PWM4 and that exist in each cycle $T_{sw}$ of the third drive signal PWM3 may alternatively be different. For details, refer to the foregoing related descriptions. Details are not described in this embodiment of this disclosure again.

According to a third aspect, frequencies of first N−1 drive pulses of the N drive pulses in the fourth drive signal PWM4 are the same, and a frequency of a last drive pulse of the N drive pulses in the fourth drive signal PWM4 is less than the frequencies of the first N−1 drive pulses.

Similarly, the following uses an example in which the fourth drive signal PWM4 has three drive pulses in low level time periods of each cycle of the third drive signal PWM3 for description.

In an example, pulse widths of a drive pulse P1, a drive pulse P2, and a drive pulse P3 are the same, and cycles of the drive pulse P1 and the drive pulse P2 (namely, first two drive pulses) are the same (that is, T1=T2). Therefore, frequencies of the drive pulse P1 and the drive pulse P2 are the same (that is, f1=f2). In addition, a cycle of the drive pulse P3 (namely, a last drive pulse of the three drive pulses) is greater than the cycles of the drive pulse P1 and the drive pulse P2, that is, a frequency of the drive pulse P3 is less than the frequency of the drive pulse P1 (or the drive pulse P2) (that is, f3<f1).

In another example, a pulse width of a drive pulse P1 may be greater than a pulse width of a drive pulse P2, and the pulse width of the drive pulse P2 may be the same as a pulse width of a drive pulse P3. In addition, cycles of the drive pulse P1 and the drive pulse P2 are the same, that is, T1=T2, that is, frequencies of the drive pulse P1 and the drive pulse P2 are the same (that is, f1=f2). In addition, a cycle of the drive pulse P3 is greater than the cycles of the drive pulse P1 and the drive pulse P2, that is, a frequency of the drive pulse P3 is less than the frequency of the drive pulse P1 (or the drive pulse P2) (that is, f3<f1).

It can be learned from the foregoing three aspects that, in this embodiment of this disclosure, the controller sends the asymmetric drive signals to the third switching transistor S3 and the fourth switching transistor S4, so that the charging and discharging frequency of the inductor L increases, and the inductance of the inductor L can still be reduced while a same ripple current percentage of the inductor L is ensured, thereby further reducing the size and the costs of the inductor L.

In a possible implementation, in this embodiment of this disclosure, (in each cycle of the first drive signal PWM1) a time between a rising edge of the first drive signal PWM1 and the rising edge of the first drive pulse of the N drive pulses in the second drive signal PWM2 may be defined as a lag time (which is the lag time defined in manner 1, and is represented by $T_{d1}$ for ease of understanding and distinguishing). Alternatively, (in each cycle of the third drive signal PWM3) a time between the rising edge of the third drive signal PWM3 and the rising edge of the first drive pulse of the N drive pulses in the fourth drive signal PWM4 may be defined as a lag time (which is the lag time defined in manner 2, and is represented by $T_{d2}$ for ease of understanding and distinguishing).

The following describes in detail, with reference to the accompanying drawings, manners of obtaining the lag times defined in the foregoing two manners.

For the lag time $T_{d1}$ defined in Manner 1, for ease of understanding, in this embodiment of this disclosure, an example in which the second drive signal PWM2 has two drive pulses in each cycle of the first drive signal PWM1 and pulse widths of the two drive pulses are the same is used for description.

In a first example, because the ripple current of the inductor L is affected by the lag time $T_{d1}$, the controller may obtain the lag time $T_{d1}$ based on the ripple current of the inductor L. To reduce the ripple current of the inductor L, in each charging and discharging cycle of the inductor L, the controller may control a charging current of the inductor L to be equal to a discharging current of the inductor L to obtain the lag time $T_{d1}$.

Figure 12:
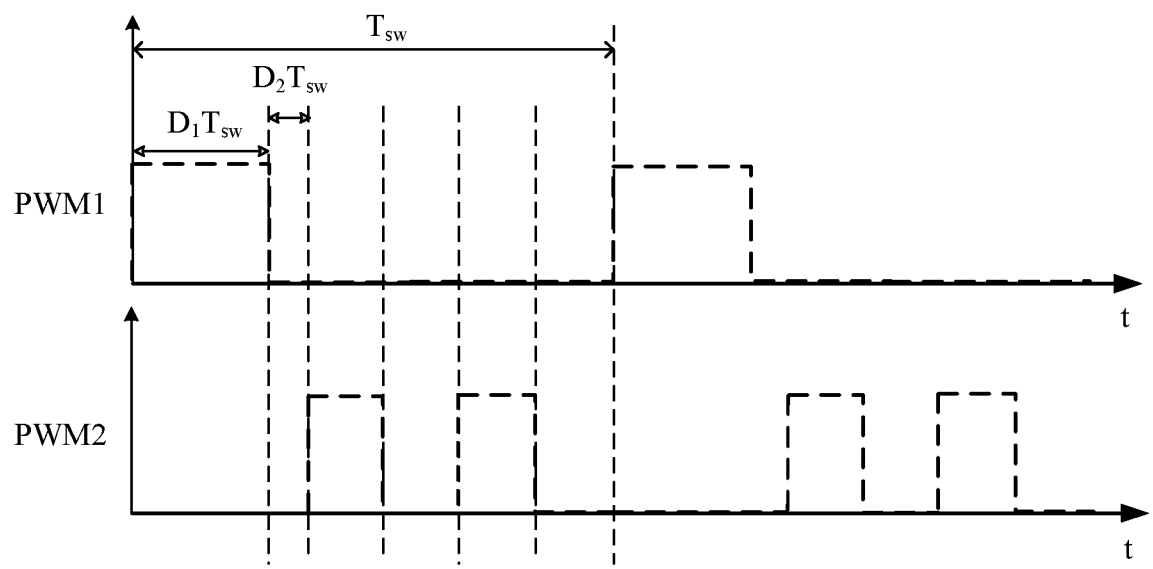
FIG. 12 is a schematic diagram of waveforms of a first drive signal and a second drive signal according to an embodiment of this disclosure.

It can be seen from FIG. 12 that the time between the rising edge of the first drive signal PWM1 and the rising edge of the first drive pulse of the two drive pulses in the second drive signal PWM2 is $D_1 T_{sw} + D_2 T_{sw}$, that is, $T_{d1} = D_1 T_{sw} + D_2 T_{sw}$.

$T_{sw}$ represents one cycle of the first drive signal PWM1. $D_1$ represents the duty cycle of the first switching transistor S1 and meets $D_1 + D_3 = 1$, and $D_3$ represents a duty cycle of the second switching transistor S3. $D_1 T_{sw}$ represents the on time of the first switching transistor S1.

Similarly, $D_2$ represents a duty cycle of the second switching transistor S2 and meets $D_2 + D_4 = 1$, and $D_4$ represents a duty cycle of the fourth switching transistor S4. $D_2 T_{sw}$ may represent a delay time between the rising edge of the first drive pulse of the two drive pulses in the second drive signal PWM2 and the falling edge of the first drive signal PWM1.

The following describes, with reference to FIG. 1 and FIG. 2, a detailed process in which the controller obtains the lag time $T_{d1}$.

The controller may obtain the lag time $T_{d1}$ based on the first voltage $V_1$ and the second voltage $V_2$ of the bidirectional direct current converter shown in FIG. 1, the voltage $V_c$ of the capacitor C, and the cycle $T_{sw}$ of the first drive signal PWM1 or the third drive signal PWM3.

Optionally, the first voltage $V_1$ may be used to indicate the output voltage of the bidirectional direct current converter, and the second voltage $V_2$ may be used to indicate the input voltage of the bidirectional direct current converter. Alternatively, the first voltage $V_1$ may be used to indicate the input voltage of the bidirectional direct current converter, and the second voltage $V_2$ may be used to indicate the output voltage of the bidirectional direct current converter. In this embodiment of this disclosure, an example in which the first voltage $V_1$ is the input voltage and the second voltage $V_2$ is the output voltage is used for description.

Refer to FIG. 2. For example, the controller sends the first drive signal PWM1 to the first switching transistor S1 and sends the second drive signal PWM2 to the second switching transistor S2. In this case, the time period F11 and the time period F12 correspond to one charging and discharging cycle of the inductor L. Then the time period F11 corresponds to that the first switching transistor S1 is turned on and the second switching transistor S2 is turned off, and the time period F12 corresponds to that both the first switching transistor S1 and the second switching transistor S2 are turned off. The inductor L meets the following equation in this charging and discharging cycle:

$$(V_1 + V_c - V_2) D_1 T_{sw} = (V_2 - V_1) D_2 T_{sw} \quad \text{Formula(1)}$$

In Formula (1), the duty cycle $D_1$ of the first drive signal PWM1 may meet:

$$D_1 = 1 - V_1 / V_2 \quad \text{Formula (2)}$$

Further, the controller may obtain the lag time $T_{d1}$ based on Formula (1) and Formula (2), thereby reducing the inductance of the inductor L.

In a second example, the controller may obtain the lag time $T_{d1}$ based on the loss of at least one of the first switching transistor S1 and the second switching transistor S2 (namely, the loss of the first switching transistor S1 and/or the loss of the second switching transistor S1).

That is, to obtain the lag time $T_{d1}$, the controller may obtain the lag time $T_{d1}$ based on only the loss of the first switching transistor S1, may obtain the lag time $T_{d1}$ based on only the loss of the second switching transistor S2, or may obtain the lag time $T_{d1}$ based on both the loss of the first switching transistor S1 and the loss of the second switching transistor S2.

For example, the controller obtains the lag time $T_{d1}$ based on only the loss of the first switching transistor S1. In this case, a time corresponding to a minimum loss of the first switching transistor S1 may be the lag time $T_{d1}$.

For another example, the controller obtains the lag time $T_{d1}$ based on only the loss of the second switching transistor S2. In this case, a time corresponding to a minimum loss of the second switching transistor S2 may be the lag time $T_{d1}$.

For another example, the controller obtains the lag time $T_{d1}$ based on both the loss of the first switching transistor S1 and the loss of the second switching transistor S2. In this case, a time corresponding to evenly distributed losses of the first switching transistor S1 and the second switching transistor S2 may be the lag time $T_{d1}$.

Therefore, the controller may obtain the lag time $T_{d1}$ based on the loss of the first switching transistor S1 and/or the loss of the second switching transistor S1, thereby reducing a loss generated by the bidirectional direct current converter and improving conversion efficiency of the bidirectional direct current converter.

In a third example, the controller may obtain the lag time $T_{d1}$ based on the ripple current of the inductor L and the loss of at least one of the first switching transistor S1 and the second switching transistor S2.

To reduce both the ripple current of the inductor L and the loss generated by the bidirectional direct current converter, the controller may obtain the lag time $T_{d1}$ by combining the first example and the second example.

Therefore, the controller can use a time corresponding to a low ripple current of the inductor L and a low loss of at least one of the first switching transistor S1 and the second switching transistor S2 as the lag time $T_{d1}$.

For the lag time $T_{d2}$ defined in Manner 2, for ease of understanding, in this embodiment of this disclosure, an example in which the fourth drive signal PWM4 has two drive pulses in each cycle of the third drive signal PWM3 and pulse widths of the two drive pulses are different is used for description.

In a first example, because the ripple current of the inductor L is affected by the lag time $T_{d2}$, the controller may obtain the lag time $T_{d2}$ based on the ripple current of the inductor L. To reduce the ripple current of the inductor L, in each charging and discharging cycle of the inductor L, the controller may control a charging current of the inductor L to be equal to a discharging current of the inductor L to obtain the lag time $T_{d2}$.

The following describes, with reference to FIG. 1, a detailed process in which the controller obtains the lag time $T_{d2}$.

In a first example, the controller may obtain the lag time $T_{d2}$ based on the loss of at least one of the third switching transistor S3 and the fourth switching transistor S4 (namely, the loss of the third switching transistor S3 and/or the loss of the fourth switching transistor S4).

That is, to obtain the lag time $T_{d2}$, the controller may obtain the lag time $T_{d2}$ based on only the loss of the third switching transistor S3, may obtain the lag time $T_{d2}$ based on only the loss of the fourth switching transistor S4, or may obtain the lag time $T_{d2}$ based on both the loss of the third switching transistor S3 and the loss of the fourth switching transistor S4.

For example, the controller obtains the lag time $T_{d2}$ based on only the loss of the third switching transistor S3. In this case, a time corresponding to a minimum loss of the third switching transistor S3 may be the lag time $T_{d2}$.

For another example, the controller obtains the lag time $T_{d2}$ based on only the loss of the fourth switching transistor S4. In this case, a time corresponding to a minimum loss of the fourth switching transistor S4 may be the lag time $T_{d2}$.

For another example, the controller obtains the lag time $T_{d2}$ based on both the loss of the third switching transistor S3 and the loss of the fourth switching transistor S4. In this case, a time corresponding to evenly distributed losses of the third switching transistor S3 and the fourth switching transistor S4 may be the lag time $T_{d2}$.

Therefore, the controller may obtain the lag time $T_{d2}$ based on the loss of the third switching transistor S3 and/or the loss of the fourth switching transistor S4, thereby reducing a loss generated by the bidirectional direct current converter and improving conversion efficiency of the bidirectional direct current converter.

In a second example, the controller may obtain the lag time T2 based on the ripple current of the inductor L and the loss of at least one of the third switching transistor S3 and the fourth switching transistor S4.

To reduce both the ripple current of the inductor L and the loss generated by the bidirectional direct current converter, the controller may obtain the lag time $T_{d2}$ by combining the first example and the second example.

Therefore, the controller can use a time corresponding to a low ripple current of the inductor L and a low loss of at least one of the third switching transistor S3 and the fourth switching transistor S4 as the lag time $T_{d2}$.

Figure 13:
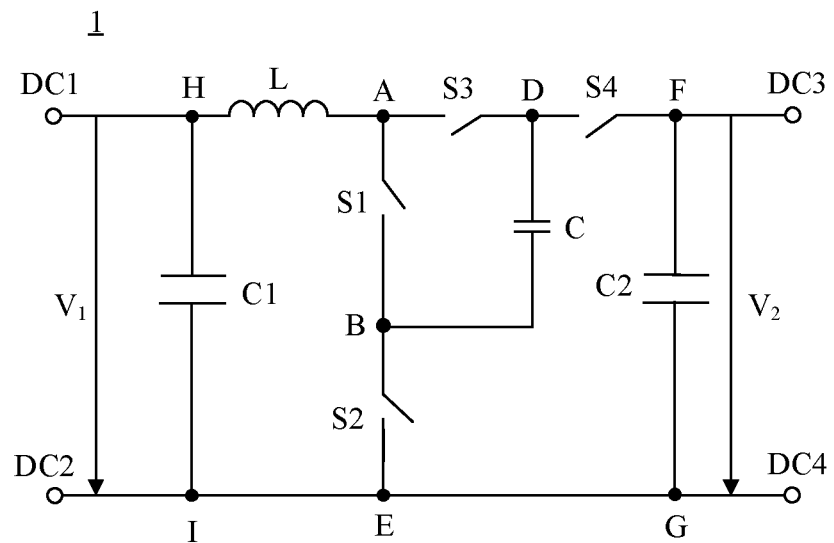
FIG. 13 is a schematic diagram of a structure of a bidirectional direct current converter according to an embodiment of this disclosure.

In a possible implementation, based on FIG. 1, the bidirectional direct current converter 1 provided in this embodiment of this disclosure may further include a capacitor C1 and a capacitor C2, as shown in FIG. 13.

The capacitor C1 is connected between a node H and a node I, the node H is connected to the first direct current terminal DC1, and the node I is connected to the second direct current terminal DC2. The capacitor C2 is connected between a node F and a node G, the node F is connected to the third direct current terminal DC3, and the node G is connected to the fourth direct current terminal DC4.

Optionally, one terminal (which may be a positive terminal) of the capacitor C1 is connected to the node H, and the other terminal (which may be a negative terminal) of the capacitor C1 is connected to the node I. One terminal (which may be a positive terminal) of the capacitor C2 is connected to the node F, and the other terminal (which may be a negative terminal) of the capacitor C2 is connected to the node G.

Figure 14:
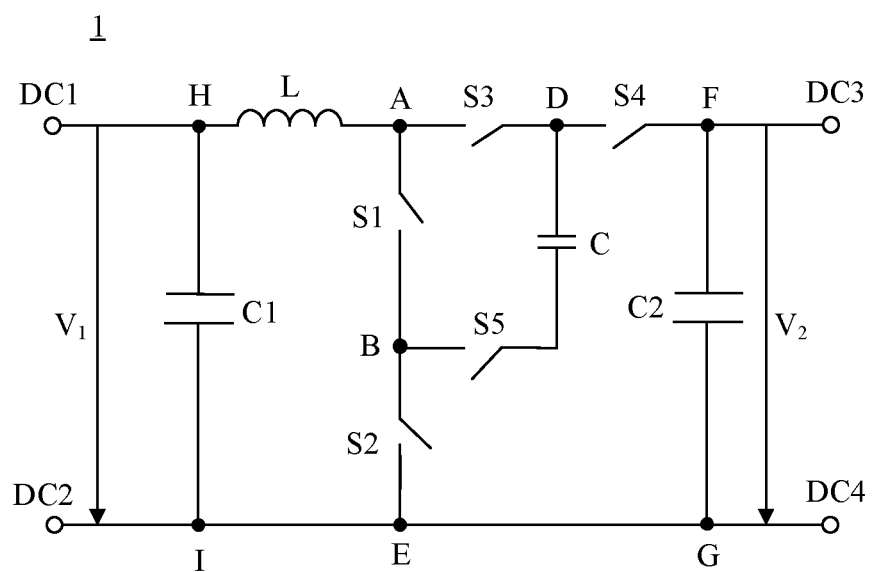
FIG. 14 is a schematic diagram of a structure of a bidirectional direct current converter according to an embodiment of this disclosure.

Further, based on FIG. 13, the bidirectional direct current converter 1 provided in this embodiment of this disclosure may further include a fifth switching transistor S5, as shown in FIG. 14. In FIG. 14, a first terminal (namely, a right terminal of the fifth switching transistor S5 in FIG. 14) of the fifth switching transistor S5 is connected to the second terminal of the capacitor C (namely, a lower terminal of the capacitor C in FIG. 14, which may be a negative terminal), and a second terminal (namely, a left terminal of the fifth switching transistor S5 in FIG. 14) of the fifth switching transistor S5 may be connected to the node B.

Optionally, similar to the foregoing four switching transistors such as the first switching transistor S1, the fifth switching transistor S5 may also use a MOS transistor, an IGBT, a bidirectional switch, or the like. Certainly, the fifth switching transistor S5 may alternatively be another type of controllable power device. A type of the fifth switching transistor S5 is not limited in this embodiment of this disclosure.

For example, the fifth switching transistor S5 is a MOS transistor. A drain of the fifth switching transistor S5 may be connected to the second terminal of the capacitor C, and a source of the fifth switching transistor S5 may be connected to the node B.

For another example, the fifth switching transistor S5 is an IGBT. A collector of the fifth switching transistor S5 may be connected to the second terminal of the capacitor C, and an emitter of the fifth switching transistor S5 may be connected to the node B.

The bidirectional direct current converter 1 shown in FIG. 14 may protect the second switching transistor S2 by using the fifth switching transistor S5. A principle is as follows.

In a process in which the bidirectional direct current converter 1 converts the first voltage $V_1$ (used as the input voltage) into the second voltage $V_2$ (used as the output voltage) (that is, a power is transmitted from left to right in FIG. 14), the controller may first control the fifth switching transistor S5 to be turned off. In this case, a current cannot flow through the capacitor C because the fifth switching transistor S5 is turned off. In this case, the first voltage $V_1$ is not applied to the second switching transistor S2. Therefore, the second switching transistor S2 is protected.

For example, when the first voltage $V_1$ is 900 volts (V) and the second voltage $V_2$ is 1200 V (the bidirectional direct current converter 1 plays a boost role), the first switching transistor S1 and the third switching transistor S3 each may use an IGBT with a low withstand voltage level, for example, 650 V. If the fifth switching transistor S5 is not disposed, the voltage $V_c$ on the capacitor C is 0 at a moment when the bidirectional direct current converter 1 is connected to a power supply, that is, the first voltage $V_1$ is almost completely applied to the second switching transistor S2. Consequently, the voltage that needs to be borne by the second switching transistor S2 exceeds voltage stress of the second switching transistor S2, and the second switching transistor S2 is damaged.

Similarly, in a process in which the bidirectional direct current converter 1 converts the second voltage $V_2$ (used as the input voltage) into the first voltage $V_1$ (used as the output voltage) (that is, a power is transmitted from right to left in FIG. 14), the controller may first control the fifth switching transistor S5 to be turned off. In this case, a current cannot flow through the capacitor C because the fifth switching transistor S5 is turned off. In this case, the second voltage $V_2$ is not applied to the second switching transistor S2. Therefore, the second switching transistor S2 may be still protected.

For example, when the first voltage $V_1$ is 900 V and the second voltage $V_2$ is 1200 V (the bidirectional direct current converter 1 plays a buck role), similarly, the first switching transistor S1 and the third switching transistor S3 each may use an IGBT with a low withstand voltage level, for example, 650 V. If the fifth switching transistor S5 is not disposed, the voltage $V_c$ on the capacitor C is 0 at a moment when the bidirectional direct current converter 1 is connected to a power supply, that is, the second voltage $V_2$ is almost completely applied to the second switching transistor S2. Consequently, the voltage that needs to be borne by the second switching transistor S2 exceeds voltage stress of the second switching transistor S2, and the second switching transistor S2 is damaged.

Figure 15:
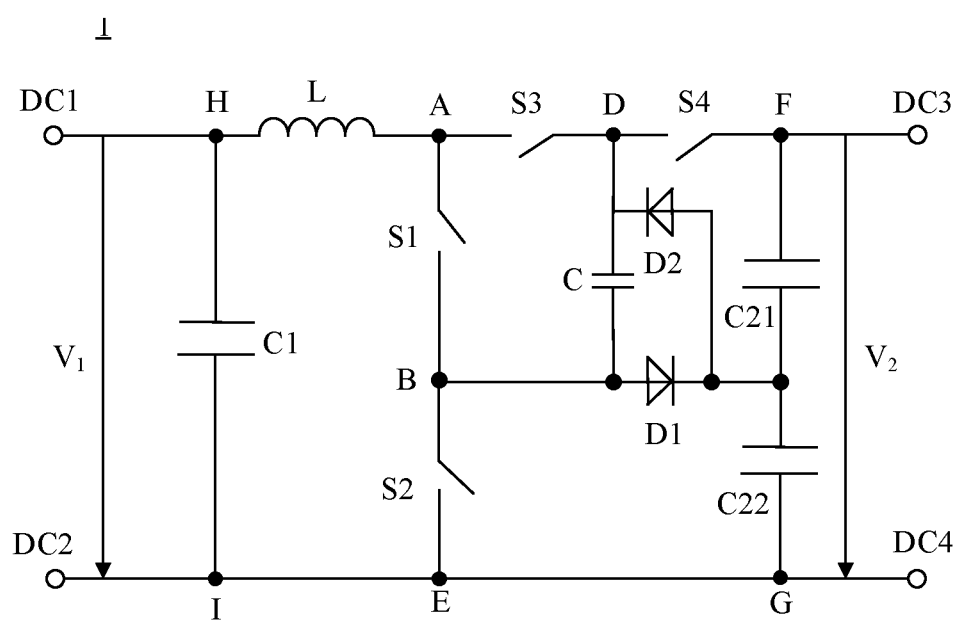
FIG. 15 is a schematic diagram of a structure of a bidirectional direct current converter according to an embodiment of this disclosure.

In another possible implementation, based on FIG. 13, considering pre-charging of the capacitor and an abrupt change of a voltage of a bus in the bidirectional direct current converter, the bidirectional direct current converter 1 provided in this embodiment of this disclosure may further include a first diode D1 and a second diode D2, as shown in FIG. 15.

In FIG. 15, the second capacitor C2 in FIG. 13 may be divided into a capacitor C21 and a capacitor C22, and a connection node between the capacitor C21 and the capacitor C22 is a node J (the node J may be understood as a midpoint of the second voltage $V_2$). An anode of the first diode D1 may be connected to a node B, and a cathode of the first diode D1 may be connected to the node J. An anode of the second diode D2 may be connected to the node J, and a cathode of the second diode D2 may be connected to the node D.

It may be understood that a function of the first diode D1 is to clamp a voltage drop borne by the second switching transistor S2, to prevent the second switching transistor S2 from bearing a voltage $V_{bus}$ (namely, the second voltage $V_2$) of an entire direct current bus when the fourth switching transistor S4 is turned on. Similarly, a function of the second diode D2 is to clamp a voltage drop borne by the fourth switching transistor S4, to prevent the fourth switching transistor S4 from bearing a voltage $V_{bus}$ (namely, the second voltage $V_2$) of an entire direct current bus when the second switching transistor S2 is turned on. Therefore, the first diode D1 and the second diode D2 may be referred to as clamping diodes.

A function of the bidirectional direct current converter 1 shown in FIG. 15 is the same as that of the bidirectional direct current converter 1 shown in FIG. 14. Both the functions are reducing the voltage stress borne by the second switching transistor S2 when the bidirectional direct current converter 1 is connected to the power supply and starts to work. The bidirectional direct current converter shown in FIG. 15 has the following advantages.

When the bidirectional direct current converter 1 is connected to the power supply and starts to perform forward working, the capacitor C is charged by using the first voltage $V_1$, and there is no moment at which the voltage of the capacitor C is zero. Therefore, the first voltage $V_1$ is not completely applied to the second switching transistor S2, thereby reducing the voltage stress borne by the second switching transistor S2, and protecting the second switching transistor S2.

Similarly, when the bidirectional direct current converter 1 is connected to the power supply and starts to perform reverse working, the capacitor C is charged by using the second voltage $V_2$, and there is no moment at which the voltage of the capacitor C is zero either. Therefore, the second voltage $V_2$ is not completely applied to the second switching transistor S2, thereby reducing the voltage stress borne by the second switching transistor S2, and protecting the second switching transistor.

Optionally, the first diode and the second diode each may alternatively be replaced with a switching transistor (for example, a MOS transistor, an IGBT, or a bidirectional switch). In this case, the controller only needs to send corresponding drive signals, so that the switching transistors implement working modes of the diodes. Details are not described in this embodiment of this disclosure again.

In conclusion, in the bidirectional direct current converters 1 shown in FIG. 14 and FIG. 15, the controller may also send the asymmetric drive signals to the first switching transistor S1 and the second switching transistor S2, and send the asymmetric drive signals to the third switching transistor S3 and the fourth switching transistor S4. This can also increase the charging and discharging frequency of the inductor L, reduce the ripple current of the inductor L, reduce the inductance of the inductor L, and reduce the size and the costs of the entire bidirectional direct current converter.

An embodiment of this disclosure further provides an electronic device. The electronic device may include a bidirectional direct current converter. For detailed descriptions of the bidirectional direct current converter, refer to the foregoing descriptions. Details are not described in this embodiment of this disclosure again.

The foregoing describes the bidirectional direct current converter in detail. The following describes a control method of the bidirectional direct current converter. As shown in FIG. 16, the control method 100 may include the following. A controller performs complementary control on a first switching transistor S1 and a third switching transistor S3, and performs complementary control on a second switching transistor S2 and a fourth switching transistor S4.

The complementary control is used to indicate that two switching transistors in complementary control cannot be simultaneously turned on or off. For example, the first switching transistor S1 and the third switching transistor S3 cannot be simultaneously turned on or off, and the second switching transistor S2 and the fourth switching transistor S4 cannot be simultaneously turned on or off.

Optionally, the controller controls a quantity of on times of the second switching transistor S2 to be greater than a quantity of on times of the first switching transistor S1 in a same cycle. It may also be understood as that, in one cycle, the controller may control a switching frequency of the second switching transistor S2 to be greater than a switching frequency of the first switching transistor S1, thereby reducing losses of the first switching transistor S1 and the second switching transistor S2.

In the control method provided in this embodiment of this disclosure, the controller controls the quantity of on times of the second switching transistor to be different from the quantity of on times of the first switching transistor in a same cycle. This can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, in any cycle of the first switching transistor S1, there may be a delay between an on moment of the first switching transistor S1 and an on moment of the second switching transistor S2. That is, the first switching transistor S1 and the second switching transistor S2 are not simultaneously turned on in any cycle.

Further, a cycle of the first switching transistor S1 may be the same as a cycle of the third switching transistor S3.

In a possible implementation, the control method may further include the following. The controller controls a quantity of on times of the fourth switching transistor S4 to be greater than a quantity of on times of the third switching transistor S3 in a same cycle. It may also be understood as that, in one cycle, the controller may control a switching frequency of the fourth switching transistor S4 to be greater than a switching frequency of the third switching transistor S3, thereby reducing losses of the third switching transistor S3 and the fourth switching transistor S4.

It may be understood that the controller controls the quantity of on times of the fourth switching transistor to be different from the quantity of on times of the third switching transistor in a same cycle. Similarly, this can increase a quantity of charging and discharging times of the inductor in one cycle, that is, increase a charging and discharging frequency of the inductor. Therefore, the inductor with a small inductance may be used while a same ripple current percentage of the inductor is ensured. In addition, the inductor with a small inductance has a small size and low costs. This can reduce a size and costs of the bidirectional direct current converter. When the size of the bidirectional direct current converter is reduced, power density of the bidirectional direct current converter can be increased.

In a possible implementation, the controller may send a first drive signal PWM1 to the first switching transistor S1, send a second drive signal PWM2 to the second switching transistor S2, send a third drive signal PWM3 to the third switching transistor S3, and send a fourth drive signal PWM4 to the fourth switching transistor S4, to implement complementary control on the first switching transistor S1 and the third switching transistor S3, and implement complementary control on the second switching transistor S2 and the fourth switching transistor S4.

Optionally, the cycle of the first switching transistor S1 may be the same as the cycle of the third switching transistor S3. Therefore, a cycle of the first drive signal may be the same as a cycle of the third drive signal.

The second drive signal may have N drive pulses in each cycle of the first drive signal, that is, the second drive signal and the first drive signal are two asymmetric drive signals.

Similarly, the fourth drive signal may also have N drive pulses in each cycle of the third drive signal, that is, the fourth drive signal and the third drive signal are two asymmetric drive signals.

An inductor in the bidirectional direct current converter has N+1 charging and discharging cycles in each cycle of the first drive signal or the third drive signal, where N may be an integer greater than or equal to 2. A value of N is not limited in this embodiment of this disclosure.

When the first switching transistor S1 is turned on, the inductor L may perform charging and discharging for at least two times by sending the second drive signal PWM2 to the second switching transistor S2. Certainly, when the second switching transistor S2 is turned off, the inductor L may alternatively perform charging and discharging for one time by sending the first drive signal PWM1 to the first switching transistor S1.

Similarly, when the third switching transistor S3 is turned on, the inductor L may perform charging and discharging for at least two times by sending the fourth drive signal PWM4 to the fourth switching transistor S4. When the fourth switching transistor S4 is turned on, the inductor L may alternatively perform charging and discharging for one time by sending the third drive signal PWM3 to the third switching transistor S3.

It can be learned that, in one cycle of the first drive signal PWM1 or the third drive signal PWM3, the inductor L has at least three charging and discharging cycles. The controller increases a charging and discharging frequency of the inductor L in each cycle (namely, frequency increase), thereby reducing an inductance of the inductor L, and reducing a size and costs of the inductor L.

It should be noted that, for detailed descriptions of the first drive signal, the second drive signal, the third drive signal, and the fourth drive signal, refer to the foregoing descriptions. Details are not described in this embodiment of this disclosure again.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A bidirectional direct current converter comprising:
   a first direct current terminal;
   a second direct current terminal;
   a third direct current terminal;
   a fourth direct current terminal;
   a first node;
   a second node;
   a third node;
   an inductor comprising:
      a first terminal coupled to the first direct current terminal; and
      a second terminal coupled to the first node;
   a first switching transistor comprising:
      a first electrode coupled to the first node; and
      a second electrode coupled to the second node;
   a second switching transistor comprising:
      a third electrode coupled to the second node; and
      a fourth electrode coupled to the second direct current terminal and the fourth direct current terminal;
   a third switching transistor comprising:
      a fifth electrode coupled to the first node; and
      a sixth electrode coupled to the third node;
   a fourth switching transistor comprising:
      a seventh electrode coupled to the third node; and
      an eighth electrode coupled to the third direct current terminal;
   a capacitor comprising:
      a third terminal coupled to the third node; and
      a fourth terminal coupled to the second node; and
   a controller coupled to the first switching transistor, the second switching transistor, the third switching transistor, and the fourth switching transistor, wherein the controller is configured to:
      perform first complementary control on the first switching transistor and the third switching transistor so that the first switching transistor and the third switching transistor cannot be simultaneously turned on or off;
      perform second complementary control on the second switching transistor and the fourth switching transistor so that the second switching transistor and the fourth switching transistor cannot be simultaneously turned on or off;
      control a first quantity of on times of the second switching transistor to be greater than a second quantity of on times of the first switching transistor in a same cycle to reduce losses of the first switching transistor and the second switching transistor; and
      control a third quantity of on times of the fourth switching transistor to be greater than a fourth quantity of on times of the third switching transistor in a same cycle to reduce losses of the third switching transistor and the fourth switching transistor.

2. The bidirectional direct current converter of claim 1, further comprising, in any cycle of the first switching transistor, a delay between an on moment of the first switching transistor and an on moment of the second switching transistor.

3. The bidirectional direct current converter of claim 2, wherein a cycle of the first switching transistor is the same as a cycle of the third switching transistor.

4. The bidirectional direct current converter of claim 1, wherein the controller is further configured to send a first drive signal to the first switching transistor, a second drive signal to the second switching transistor, a third drive signal to the third switching transistor, and a fourth drive signal to the fourth switching transistor to implement the first complementary control on the first switching transistor and the third switching transistor and the second complementary control on the second switching transistor and the fourth switching transistor, wherein the second drive signal has first N drive pulses in each cycle of the first drive signal, wherein the fourth drive signal has second N drive pulses in each cycle of the third drive signal, wherein the inductor has N+1 charging and discharging cycles in each cycle of the first drive signal or the third drive signal, and wherein N is an integer greater than or equal to 2.

5. The bidirectional direct current converter of claim 4, wherein the first N drive pulses are in low level time periods of each cycle of the first drive signal.

6. The bidirectional direct current converter of claim 4, wherein a first part of pulses of the second N drive pulses are in low level time periods of each cycle of the third drive signal, and wherein a second part of pulses of the second N drive pulses are in high level time periods of each cycle of the third drive signal.

7. The bidirectional direct current converter of claim 4, wherein frequencies corresponding to at least two of the first N drive pulses or the second N drive pulses are different.

8. The bidirectional direct current converter of claim 7, wherein a frequency corresponding to each of the first N drive pulses or the second N drive pulses is different.

9. The bidirectional direct current converter of claim 7, wherein a pulse width of each of the first N drive pulses or the second N drive pulses is the same.

10. The bidirectional direct current converter of claim 4, wherein N≥3.

11. The bidirectional direct current converter of claim 10, wherein frequencies of first N−1 drive pulses of the first N drive pulses or the second N drive pulses are the same, and wherein a frequency of a last drive pulse of the first N drive pulses or the second N drive pulses is less than the frequencies.

12. The bidirectional direct current converter of claim 4, wherein, in each cycle of the first drive signal, a rising edge of a first drive pulse of the first N drive pulses is behind a falling edge of the first drive signal.

13. The bidirectional direct current converter of claim 12, wherein, in each cycle of the third drive signal, a rising edge of a first drive pulse of the second N drive pulses is in front of a falling edge of the third drive signal.

14. The bidirectional direct current converter of claim 13, wherein, in each cycle of the first drive signal, a time between a rising edge of the first drive signal and the rising edge of the first drive pulse of the first N drive pulses is a first lag time, or wherein, in each cycle of the third drive signal, a time between a rising edge of the third drive signal and the rising edge of the first drive pulse of the second N drive pulses is a second lag time.

15. The bidirectional direct current converter of claim 14, wherein the controller is further configured to control, in each charging cycle of the inductor and discharging cycle of the inductor, a charging current of the inductor to be equal to a discharging current of the inductor to obtain the first lag time or the second lag time.

16. The bidirectional direct current converter of claim 15, wherein the controller is further configured to:
obtain the first lag time or the second lag time based on a first voltage of the bidirectional direct current converter, a second voltage of the bidirectional direct current converter, a third voltage of the capacitor, and a cycle of the first drive signal or a cycle of the third drive signal,
wherein:
the first voltage indicates a first input voltage of the bidirectional direct current converter and the second voltage indicates a first output voltage of the bidirectional direct current converter; or
the first voltage indicates a second output voltage of the bidirectional direct current converter and the second voltage indicates a second input voltage of the bidirectional direct current converter.

17. The bidirectional direct current converter of claim 16, wherein the controller is further configured to obtain the first lag time or the second lag time according to a formula, wherein the formula comprises:

$$(V_1+V_c-V_2)D_1T_{sw}=(V_2-V_1)D_2T_{sw},$$

wherein the first lag time or the second lag time is $(D_1+D_2)T_{sw}$, wherein $V_1$ represents the first voltage, wherein $V_2$ represents the second voltage, wherein $V_c$ represents the third voltage, wherein $T_{sw}$ represents the cycle of the first drive signal or the cycle of the third drive signal, wherein $D_1$ represents a duty cycle of the first drive signal, and wherein $D_2T_{sw}$ represents a delay time between the rising edge of the first drive pulse of the first N drive pulses and the falling edge of the first drive signal.

18. The bidirectional direct current converter of claim 14, wherein the controller is further configured to:
obtain the first lag time or the second lag time based on a loss of the first switching transistor or a loss of the second switching transistor;
obtain the first lag time or the second lag time based on a loss of the third switching transistor or a loss of the fourth switching transistor;
obtain the first lag time or the second lag time based on a ripple current of the inductor and the loss of at least one of the first switching transistor or the second switching transistor; or
obtain the first lag time or the second lag time based on the ripple current and the loss of at least one of the third switching transistor or the fourth switching transistor,
wherein each cycle of the first drive signal is the same as each cycle of the third drive signal, and
wherein the bidirectional direct current converter further comprises a fifth switching transistor comprising:
a fifth terminal coupled to the fourth terminal; and
a sixth terminal coupled to the second node.

19. A control method of a bidirectional direct current converter comprising:
performing, by a controller of the bidirectional direct current converter, complementary control on a first switching transistor of the bidirectional direct current converter and a third switching transistor of the bidirectional direct current converter so that the first switching transistor and the third switching transistor cannot be simultaneously turned on or off, wherein the bidirectional direct current converter further comprises a second switching transistor, a fourth switching transistor, a capacitor, and an inductor, wherein a first terminal of the inductor is coupled to a first direct current terminal of the bidirectional direct current converter, wherein a second terminal of the inductor is coupled to a first node of the bidirectional direct current converter, wherein a first electrode of the first switching transistor is coupled to the first node, wherein a second electrode of the first switching transistor is coupled to a second node of the bidirectional direct current converter, wherein a first electrode of the second switching transistor is coupled to the second node, wherein a second electrode of the second switching transistor is coupled to a second direct current terminal of the bidirectional direct current converter and a fourth direct current terminal of the bidirectional direct current converter, wherein a first electrode of the third switching transistor is coupled to the first node, wherein a second electrode of the third switching transistor is coupled to a third node, wherein a first electrode of the fourth switching transistor is coupled to the third node, wherein a second electrode of the fourth switching transistor is coupled to a third direct current terminal of the bidirectional direct current converter, wherein a first terminal of the capacitor is coupled to the third node, wherein a second terminal of the capacitor is coupled to the second node, and wherein the controller is coupled to the first switching transistor, the second switching transistor, the third switching transistor, and the fourth switching transistor;
performing, by the controller, the complementary control on the second switching transistor and the fourth switching transistor so that the second switching transistor and the fourth switching transistor cannot be simultaneously turned on or off;
controlling a first quantity of on times of the second switching transistor to be greater than a second quantity of on times of the first switching transistor in a same cycle to reduce losses of the first switching transistor and the second switching transistor; and
controlling a third quantity of on times of the fourth switching transistor to be greater than a fourth quantity of on times of the third switching transistor in a same cycle to reduce losses of the third switching transistor and the fourth switching transistor.

20. A bidirectional direct current converter comprising:
a first direct current terminal;
a second direct current terminal;
a third direct current terminal;
a fourth direct current terminal;
a first node;
a second node;
a third node;
an inductor comprising:
a first terminal coupled to the first direct current terminal; and
a second terminal coupled to the first node;

a first switching transistor comprising:
  a first electrode coupled to the first node; and
  a second electrode coupled to the second node;
a second switching transistor comprising:
  a third electrode coupled to the second node; and
  a fourth electrode coupled to the second direct current terminal and the fourth direct current terminal;
a third switching transistor comprising:
  a fifth electrode coupled to the first node; and
  a sixth electrode coupled to the third node;
a fourth switching transistor comprising:
  a seventh electrode coupled to the third node; and
  an eighth electrode coupled to the third direct current terminal;
a capacitor comprising:
  a third terminal coupled to the third node; and
  a fourth terminal coupled to the second node; and
a controller coupled to the first switching transistor, the second switching transistor, the third switching transistor, and the fourth switching transistor, wherein the controller is configured to:
  perform first complementary control on the first switching transistor and the third switching transistor so that the first switching transistor and the third switching transistor cannot be simultaneously turned on or off;
  perform second complementary control on the second switching transistor and the fourth switching transistor so that the second switching transistor and the fourth switching transistor cannot be simultaneously turned on or off;
  control a first quantity of on times of the second switching transistor to be greater than a second quantity of on times of the first switching transistor in a same cycle to reduce losses of the first switching transistor and the second switching transistor; and
  send a first drive signal to the first switching transistor, a second drive signal to the second switching transistor, a third drive signal to the third switching transistor, and a fourth drive signal to the fourth switching transistor to implement the first complementary control on the first switching transistor and the third switching transistor and the second complementary control on the second switching transistor and the fourth switching transistor,
wherein the second drive signal has first N drive pulses in each cycle of the first drive signal, wherein the fourth drive signal has second N drive pulses in each cycle of the third drive signal, wherein the inductor has N+1 charging and discharging cycles in each cycle of the first drive signal or the third drive signal, and wherein N is an integer greater than or equal to 2.

* * * * *

UNITED STATES PATENT AND TRADEMARK OFFICE
CERTIFICATE OF CORRECTION

| | | |
|---|---|---|
| PATENT NO. | : 12,328,071 B2 | Page 1 of 1 |
| APPLICATION NO. | : 18/063321 | |
| DATED | : June 10, 2025 | |
| INVENTOR(S) | : Jun Wang et al. | |

It is certified that error appears in the above-identified patent and that said Letters Patent is hereby corrected as shown below:

In the Claims

Claim 17, Column 37, Line 35: "$(V^1+V_c-V_2)$" should read "$(V_1+V_c-V_2)$"

Signed and Sealed this
Twenty-ninth Day of July, 2025

Coke Morgan Stewart
*Acting Director of the United States Patent and Trademark Office*